United States Patent
Tokunaga

(10) Patent No.: US 7,872,934 B2
(45) Date of Patent: Jan. 18, 2011

(54) SEMICONDUCTOR DEVICE AND METHOD FOR WRITING DATA INTO MEMORY

(75) Inventor: Hajime Tokunaga, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 47 days.

(21) Appl. No.: 12/326,120

(22) Filed: Dec. 2, 2008

(65) Prior Publication Data
US 2009/0154262 A1 Jun. 18, 2009

(30) Foreign Application Priority Data
Dec. 14, 2007 (JP) ............... 2007-323224

(51) Int. Cl.
*G11C 17/18* (2006.01)
(52) U.S. Cl. ............... 365/225.7; 365/96
(58) Field of Classification Search ............ 365/225.7, 365/96
See application file for complete search history.

(56) References Cited

U.S. PATENT DOCUMENTS

| | | |
|---|---|---|
| 5,426,614 A | 6/1995 | Harward |
| 6,051,851 A | 4/2000 | Ohmi et al. |
| 6,690,597 B1 | 2/2004 | Perlov et al. |
| 2006/0291315 A1* | 12/2006 | Andre et al. ............. 365/225.7 |
| 2008/0025061 A1* | 1/2008 | Scheuerlein et al. .......... 365/96 |
| 2008/0043509 A1* | 2/2008 | Schmitt et al. ................ 365/96 |
| 2008/0083954 A1 | 4/2008 | Tokunaga |
| 2008/0101108 A1 | 5/2008 | Tokunaga et al. |
| 2008/0116500 A1 | 5/2008 | Tokunaga |
| 2008/0224140 A1 | 9/2008 | Tokunaga et al. |
| 2008/0224229 A1 | 9/2008 | Tajima et al. |

FOREIGN PATENT DOCUMENTS

| | | |
|---|---|---|
| EP | 0 680 087 | 11/1995 |
| JP | 60-117660 | 6/1985 |
| JP | 07-297293 | 11/1995 |
| JP | 2005-289634 | 10/2005 |

* cited by examiner

*Primary Examiner*—Huan Hoang
*Assistant Examiner*—Jason Lappas
(74) *Attorney, Agent, or Firm*—Nixon Peabody LLP; Jeffrey L. Costellia

(57) ABSTRACT

It is an object to provide memory and a semiconductor device in which falsification of data written thereinto is prevented. The memory includes a memory circuit, a writing circuit, and a reading circuit. The memory circuit has a memory cell array in which a plurality of memory cells where "0" and "1" of binary data can be written are arranged. The writing circuit includes a first writing circuit which writes one of "0" and "1" of binary data into one of the memory cells included in the memory circuit, and a second writing circuit which writes the other of "0" and "1" of binary data into one of the memory cells included in the memory circuit.

11 Claims, 16 Drawing Sheets

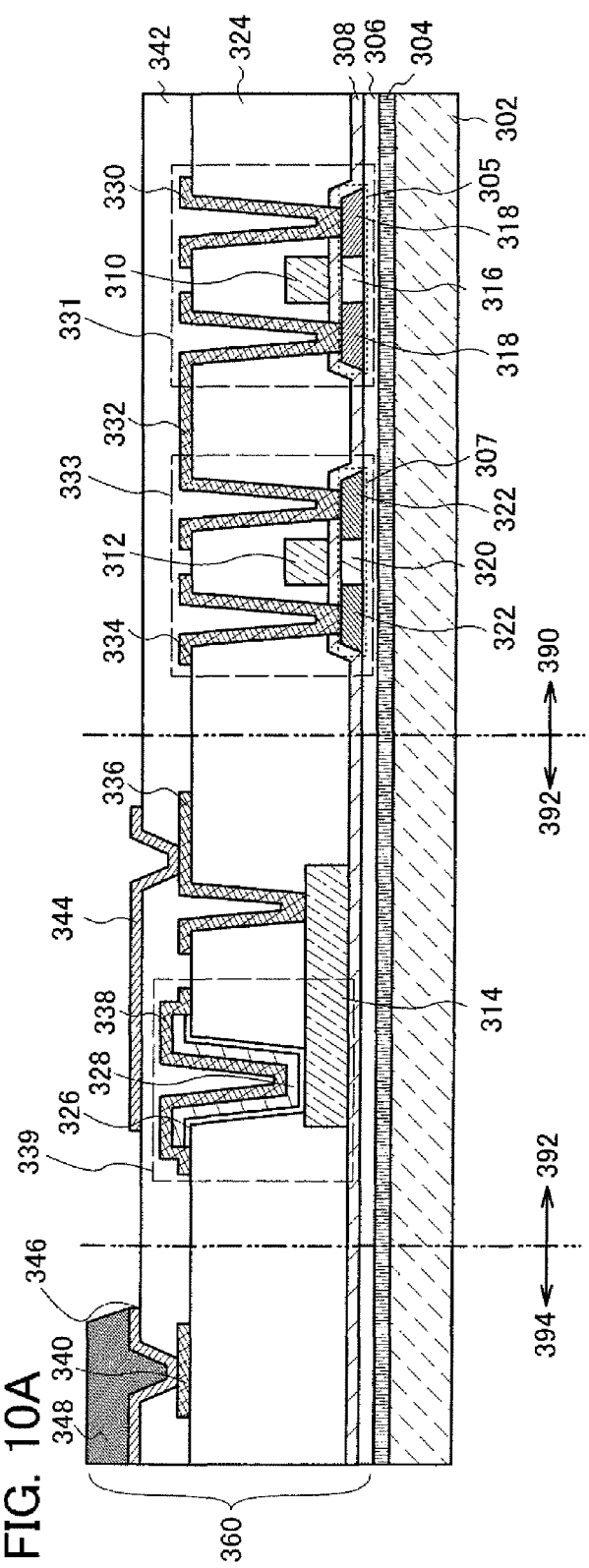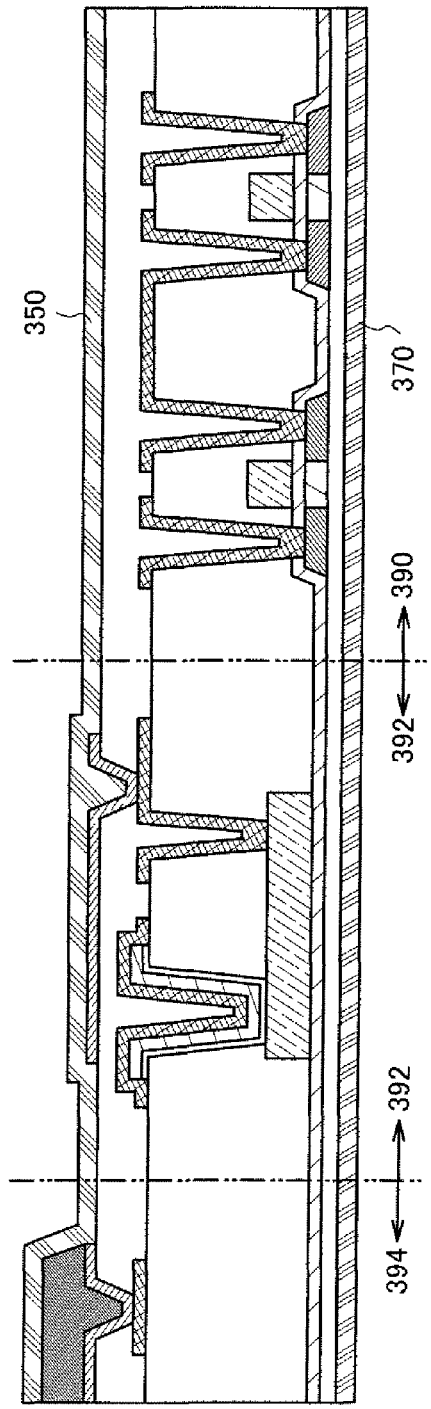

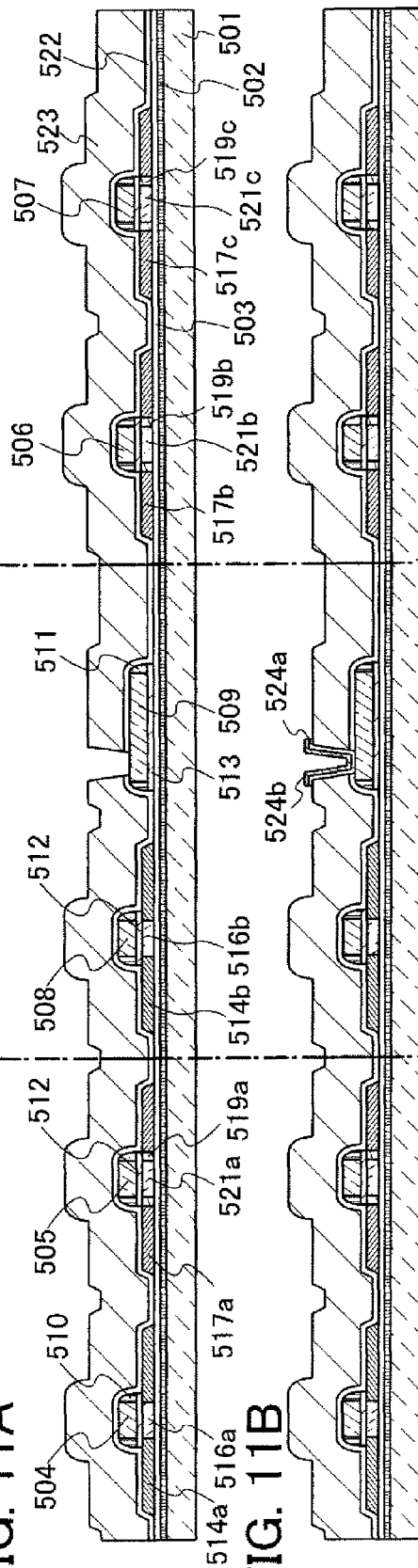

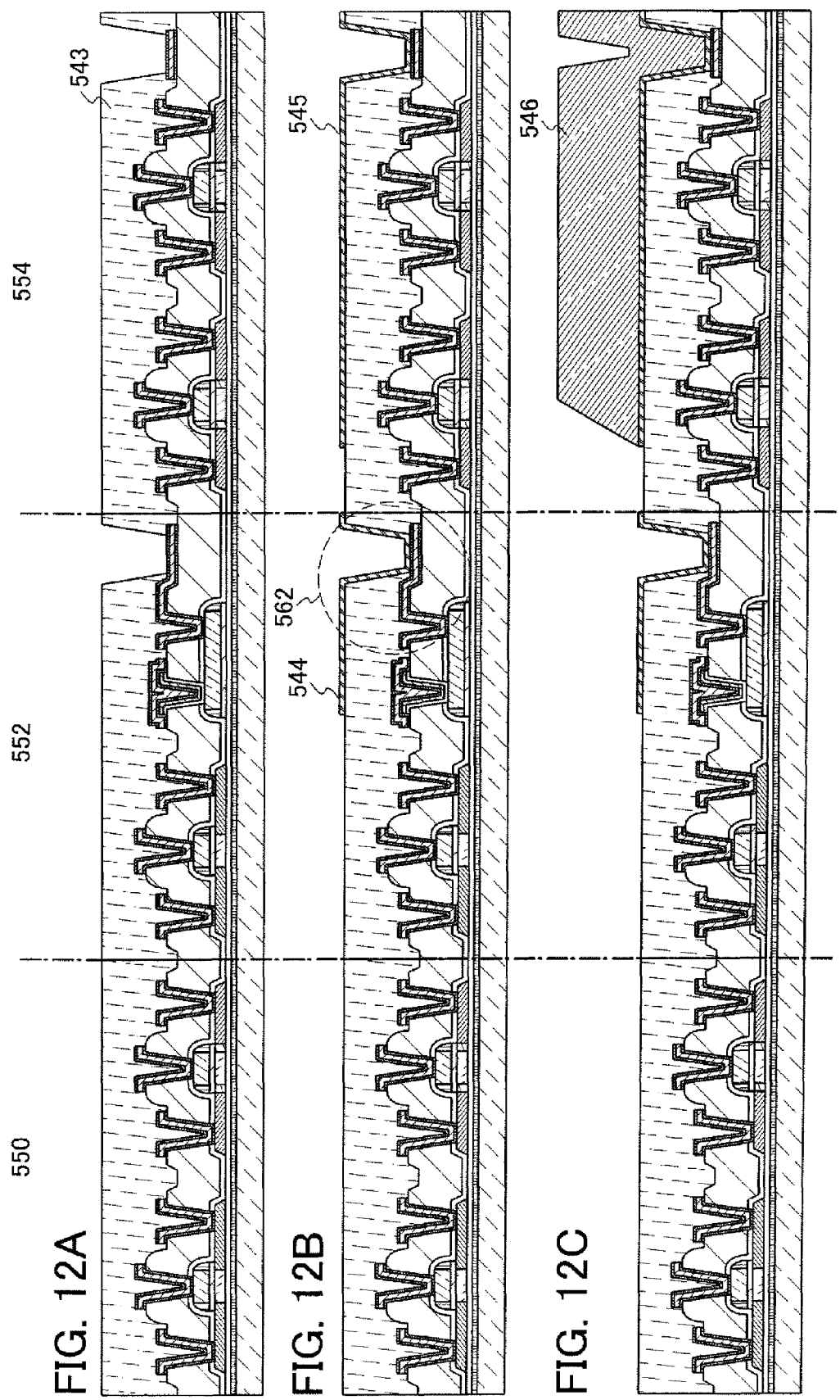

SEMICONDUCTOR DEVICE AND METHOD FOR WRITING DATA INTO MEMORY

BACKGROUND OF THE INVENTION

1. Field of the Invention

The present invention relates to memory and a semiconductor device including the memory, in particular relates to antifuse type memory. Further, the present invention relates to a semiconductor device which can perform writing and reading of data by radio

2. Description of the Related Art

A technique called RFID (radio frequency identification) has attracted attention and has been applied to various fields such as distribution, historical management, article management, presence management, or the like. RFID refers to data communication using a radio communication technique in a restricted sense. Radio communication is performed between an RFID tag (also referred to as an RF tag, an ID tag, an IC tag, or a radio tag) and a reader/writer, so that writing and reading of data can be performed.

In recent years, use of RFID at the airport has been considered, and as an example thereof a baggage handling system can be given. For example, Patent Document 1 (Japanese Published Patent Application No. 2005-289634) discloses a system by which baggage of users (passengers) is managed using RFID. Specifically, an RFID tag is attached to baggage, necessary data (a name, an address, an inspection result and the like of a user) is written into the RFID tag as needed and the data written into the RFID tag is read and managed, whereby security or convenience is improved.

SUMMARY OF THE INVENTION

Data which is to be written into an RFID tag is written into memory mounted on the RFID tag. In the case where REID is applied to handling of baggage, in order to prevent loss, theft, or the like of baggage, it is preferable that data which has been written once can not be rewritten. Therefore, memory where reading and one-time writing are possible, that is, so-called write-once memory memory has been demanded.

As write-once memory, a fuse type element such as a fuse or an antifuse which allows data to be written by controlling a conductive state and a non-conductive state is known. A state of an antifuse is a non-conductive state at the time of manufacture and is changed to a conductive state by applying an electric signal of greater than or equal to a predetermined threshold. In general, in the case of using an antifuse as memory, binary data correspond to a non-conductive state at the time of manufacture, that is, an initial state (a high resistance state), and a conductive state obtained after writing is performed (a low resistance state), whereby data is written.

However, by application of an electric signal of greater than or equal to a threshold to an antifuse in the non-conductive state after predetermined data is written into memory, the state of the antifuse can be changed to the conductive state. Therefore, in the case of applying such an antifuse to handling of baggage such as a baggage handling system, there is concern that security or safety is reduced due to theft of baggage by falsifying data, mounting of a dangerous article on a plane, or the like. Further, in the case of applying such an antifuse for traceability of food, there is concern that problems related to food security such as falsification of expiration date or a place of origin are caused.

In view of the foregoing problem, it is an object of the present invention to provide memory and a semiconductor device in which falsification of written data is prevented. It is another object of the present invention to provide write-once memory where data writing can be newly performed as needed after manufacturing memory or after manufacturing a semiconductor device. It is another object of the present invention to provide a method of writing data into memory having a structure in which falsification of data is prevented. It is still another object of the present invention to provide a radio chip provided with write-once read-many memory having a structure in which falsification of data is prevented.

A semiconductor device includes a memory circuit, a writing circuit and a reading circuit. The memory circuit includes a memory cell array in which a plurality of memory cells where "0" and "1" of binary data can be written are arranged. The writing circuit includes a first writing circuit which writes one of "0" and "1" of binary data to one of the memory cells included in the memory circuit, and a second writing circuit which writes the other of "0" and "1" of binary data into one of the memory cells included in the memory circuit.

Each of the memory cells included in the memory circuit has an antifuse in one state selected from "a first state" which is an initial state, "a second state" obtained by writing operation by the first writing circuit, or "a third state" obtained by writing operation by the second writing circuit. The antifuse has an element structure in which the state of the antifuse is changed from "the first state" to "the second state" or "the third state". Data is written into the memory cell in blocks or in memory cells and it is distinguished whether or not data has been written into blocks or in memory cells. In each of the memory cells included in a block where data has been written, antifuses in "the second state" or "the third state" are arranged. An antifuse in "the second state" or an antifuse in "the third state" correspond to "0" or "1" of binary data and data is written into the memory cell. Note that in each of the memory cells included in a block where data has been written, no antifuse in "the first state" is present. That is, in each of the memory cells included in a block where data has been written, an antifuse in "the second state" or "the third state" is always needed to be arranged. Further, in each of the memory cells included in a block where data has not been written, an antifuse in "the first state" is arranged.

An antifuse in "the second state" or "the third state" can be obtained by performing writing operation on the antifuse in "the first state" by the first writing circuit or the second writing circuit. Accordingly, data can be written additionally into a block or a memory cell where data has not been written and which includes an antifuse in "the first state".

One aspect of the present invention is a semiconductor device having a memory circuit which includes a memory cell array where a plurality of memory cells into which "0" and "1" of binary data can be written are arranged; a first writing circuit which writes one of "0" and "1" of binary data into one of the memory cells included in the memory circuit; a second writing circuit which writes the other of "0" and "1" of binary data into one of the memory cells included in the memory circuit; and a reading circuit which reads binary data written into one of the memory cells included in the memory circuit. Each of the memory cells included in the memory circuit has an antifuse in one state selected from "a first state" which is an initial state, "a second state" obtained by performing writing operation on an antifuse in "the first state" by the first writing circuit, or "a third state" obtained by performing writing operation into an antifuse in "the first state" by the second writing circuit. "The second state" or "the third state" of the antifuse corresponds to "0" or "1" of binary data.

The semiconductor device can have a selection circuit which selects the first writing circuit or the second writing circuit and executes data writing to the memory circuit.

In the above-described structure, the antifuse included in the memory cell can have an element structure in which a first electrode, an insulating layer, a silicon layer and a second electrode are stacked. The antifuse included in the memory cell has an element structure in which the state of the antifuse is changed from "the first state" to "the second state" or "the third state".

Further, in the above-described structure, as for the antifuse included in the memory cell, the antifuse in "the second state" has a higher electric resistance than that in "the third state", and as for the antifuse included in the memory cell, the antifuse in "the first state" has a higher electric resistance than that in "the second state".

Further, in the above-described structure, each of the memory cells included in the memory circuit can have a transistor which is electrically connected to the antifuse, in addition to the antifuse. Application of writing voltage is preferably controlled by the transistor.

Another aspect of the present invention is a method for performing data writing into memory. The memory has a memory circuit including a memory cell array in which a plurality of memory cells each having an antifuse where "0" and "1" of binary data can be written, are arranged; a first writing circuit; and a second writing circuit. In a case of writing one of "0" and "1" of binary data into one of the memory cells included in the memory circuit, writing operation into the antifuse in "a first state" is performed by the first writing circuit. In a case of writing the other of "0" and "1" of binary data into one of the memory cells included in the memory circuit, writing operation into the antifuse in "the first state" is performed by the second writing circuit.

The antifuse can have a structure in which a first electrode, an insulating layer, a silicon layer and a second electrode are stacked. Further, the antifuse can have an element structure in which the state of the antifuse is changed from "the first state" to "the second state" or "the third state".

In the method for writing data, one of the memory cells before writing operation has an antifuse in "the first state" which is an initial state When writing operation into an antifuse in "the first state" is performed by the first writing circuit, the state of the antifuse is changed to "the second state". When writing operation into an antifuse in "the first state" is performed by the second writing circuit, the state of the antifuse is changed to "the third state". One of "0" and "1" of binary data is assigned to the antifuse in "the second state" and the other of "0" and "1" of binary data is assigned to the antifuse in "the third state", whereby data can be written.

Note that in this specification, a numeral such as "first" or "second" included in a term is given for convenience in order to distinguish elements, does not limit the number and does not limit the arrangement and the order of the steps.

The present invention can realize write-once read-many memory where data cannot be rewritten. Accordingly, memory in which falsification of data which has been written once can be prevented and new data can be written as needed and a semiconductor device provided with the memory can be provided. In addition, a method of writing data into the memory in which falsification of data is prevented can be provided.

BRIEF DESCRIPTION OF THE DRAWINGS

In the accompanying drawings:

FIGS. 10A and 10B are cross-sectional views illustrating manufacturing steps of the semiconductor device of the present invention;

FIGS. 11A to 11D are cross-sectional views illustrating manufacturing steps of the semiconductor device of the present invention;

FIGS. 12A to 12C are cross-sectional views illustrating manufacturing steps of the semiconductor device of the present invention;

DETAILED DESCRIPTION OF THE INVENTION

Figure 1:
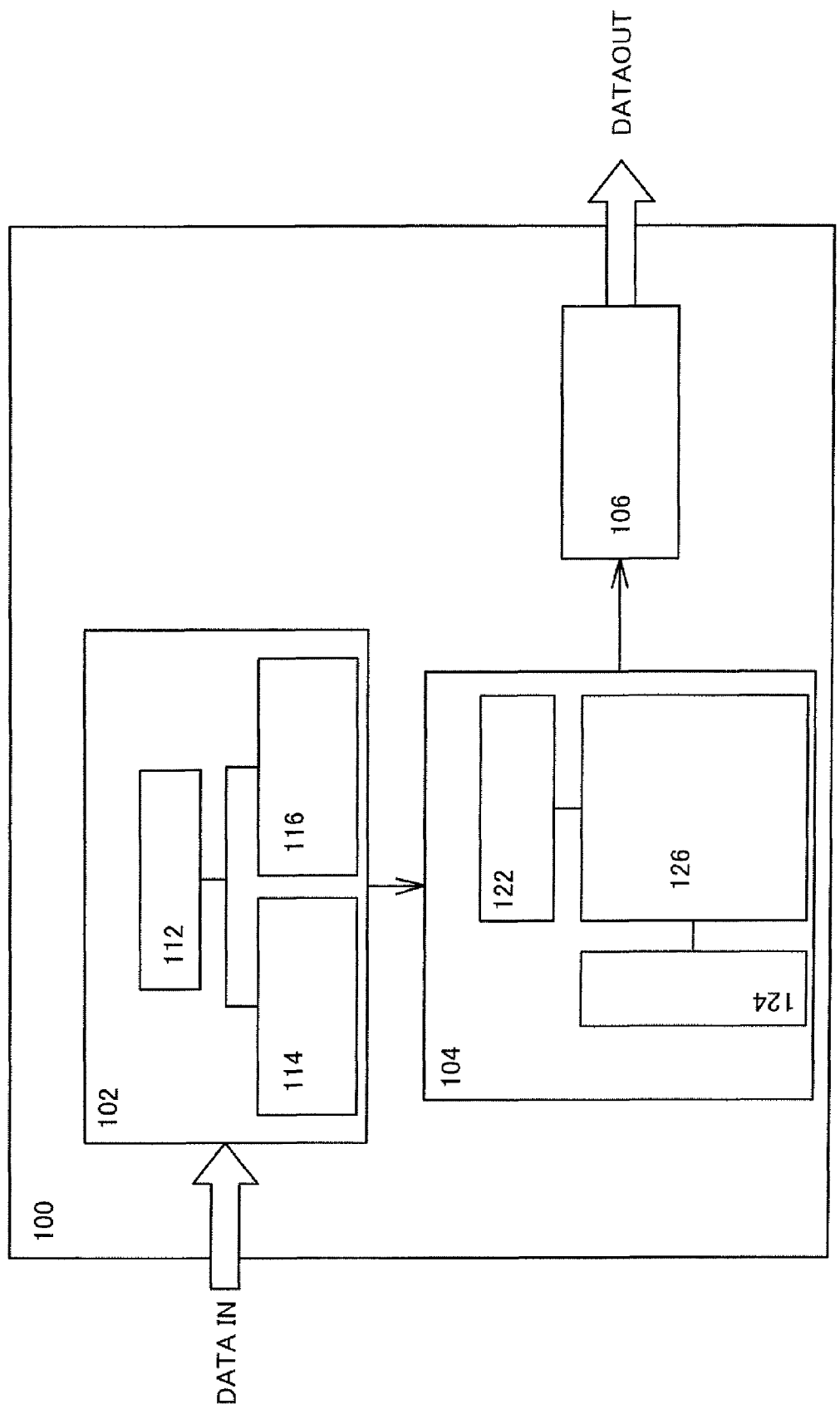
FIG. 1 is a block diagram illustrating an example of a semiconductor device of the present invention.

Hereinafter, embodiment modes of the present invention will be described. It is easily understood by those skilled in the art that a mode and/or a detail of the present invention can be variously changed unless departing from the scope and spirit of the present invention. Therefore, the present invention is not construed as being limited to the description of the embodiment modes given below. Note that the same reference numeral is commonly used to denote the same component among the different drawings in the structure of the present invention described below.

Embodiment Mode 1

As a semiconductor device of the present invention, a structure example and an operation example of memory will be described. Memory described in this embodiment mode includes a plurality of memory cells each having an antifuse and the antifuse is a fuse a state of which is changed from a high resistance state to a low resistance state by application of a predetermined voltage. Further, data writing into the memory of the present invention is performed in blocks or in memory cells and it is distinguished in blocks or in memory cells whether or not data has been written. In this embodiment mode, data writing into the antifuse is performed in blocks and it is distinguished in blocks whether or not data has been written.

FIG. 1 is a block diagram illustrating a structure example of the semiconductor device of the present invention. Memory 100 includes a writing circuit 102, a memory circuit 104 and a reading circuit 106. Data (DATA IN) input to the memory 100 is written into the memory circuit 104 by the writing circuit 102 as binary data of "0" and "1". Then, the binary data written into the memory circuit 104 is read by the reading circuit 106 and data (DATA OUT) is output from the memory 100. In the memory 100, the writing circuit 102 is connected to the memory circuit 104 at the time of writing operation, while the reading circuit 106 is connected to the memory circuit 104 at the time of reading operation. Note that converting the data input to the memory 100 into binary data may be performed by the writing circuit 102 or the memory circuit 104. Alternatively, a circuit for converting the data input to the memory 100 into binary data may be provided separately. The binary data read from the memory circuit 104 may be converted into data by the reading circuit 106. Alternatively, a circuit for converting the binary data into data may be provided separately.

The data input to the memory 100 is written into the memory circuit 104 by the writing circuit 102. Note that the data input to the memory 100 is written into the memory circuit 104 as binary data of "0" and "1" by the wiring circuit 102. Writing operation is selectively performed in the memory circuit 104 by one of a first writing circuit 114 and a second writing circuit 116 and then binary data is written into the memory circuit 104. A selection circuit 112 selects the first writing circuit 114 or the second writing circuit 116.

Figure 2A:
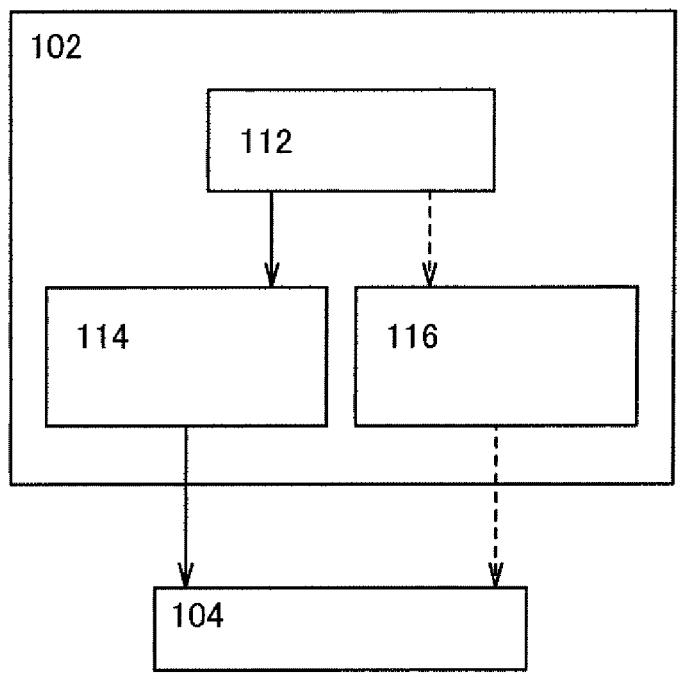
FIGS. 2A and 2B are block diagrams each illustrating an example of a writing circuit of the present invention.
Figure 2B:
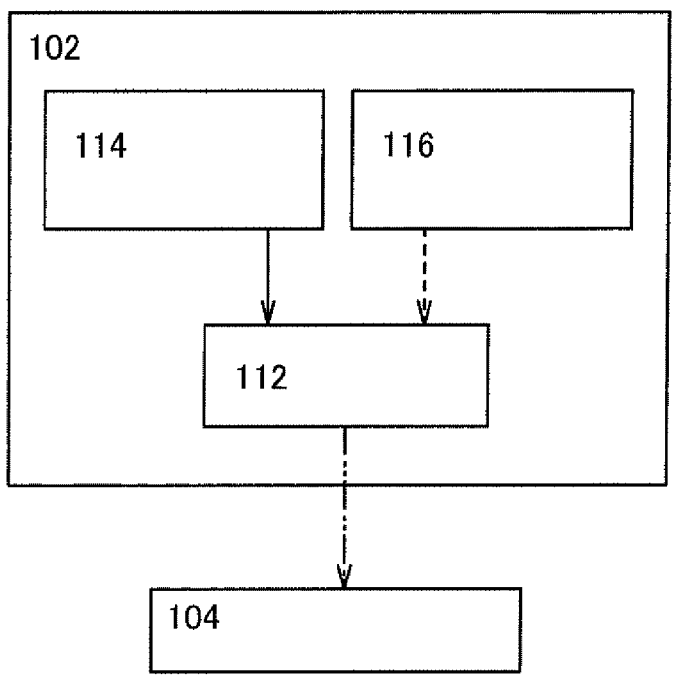

Note that the first writing circuit 114 or the second writing circuit 116 is selectively connected to the memory circuit 104 by the selection circuit 112. There is no particular limitation on connection relation. As illustrated in FIG. 2A, a structure may be employed in which the selection circuit 112 is connected to the first writing circuit 114 or the second writing circuit 116 and the first writing circuit 114 or the second writing circuit 116 is connected to the memory circuit 104. Alternatively, as illustrated in FIG. 2B, a structure can be employed in which the first writing circuit 114 or the second writing circuit 116 is connected to the selection circuit 112 and the selection circuit 112 is connected to the memory circuit 104. One of the first writing circuit 114 and the second writing circuit 116, which is selected by the selection circuit 112, is connected to the memory circuit 104 and writing operation into the memory circuit 104 is performed.

The data written into the memory circuit 104 is read and output from the memory 100 by the reading circuit 106. Note that "0" and "1" of binary data written into the memory circuit are read and output as data by the reading circuit 106.

Figure 3A:
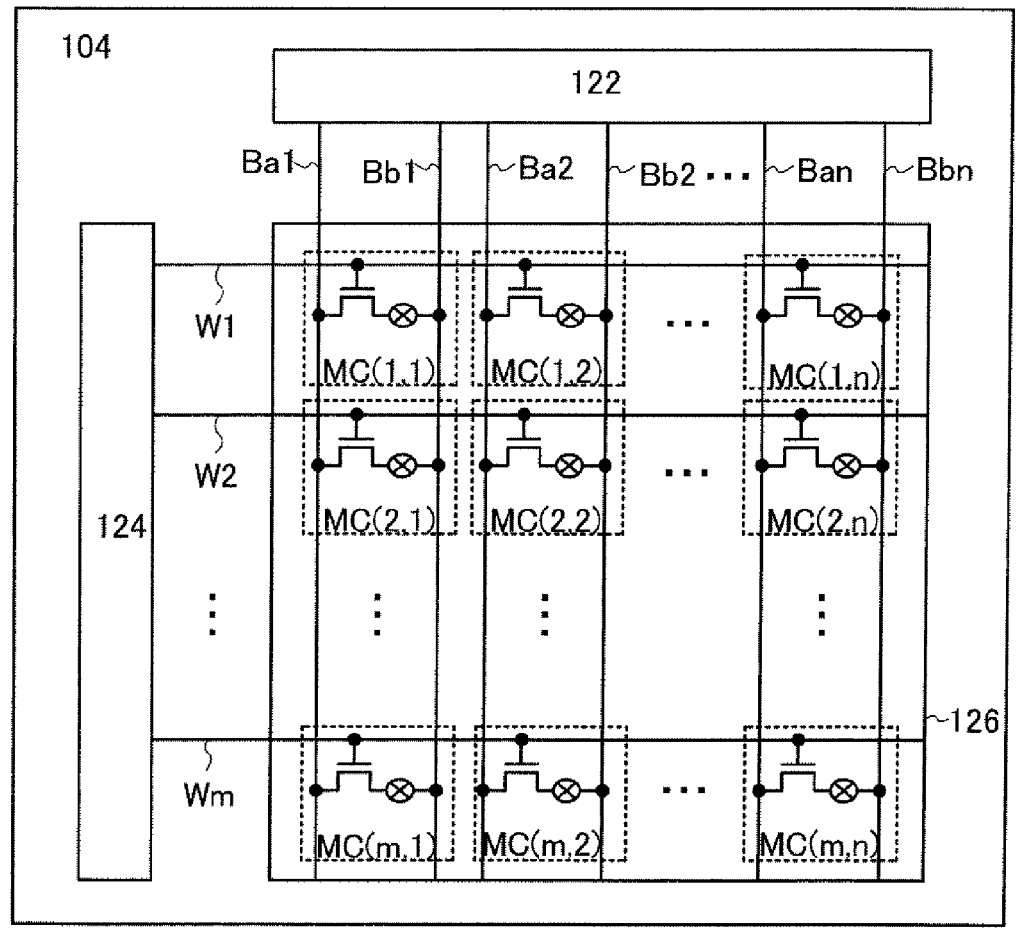
FIGS. 3A and 3B are circuit diagrams illustrating an example of a memory circuit and a memory cell, respectively.
Figure 3B:
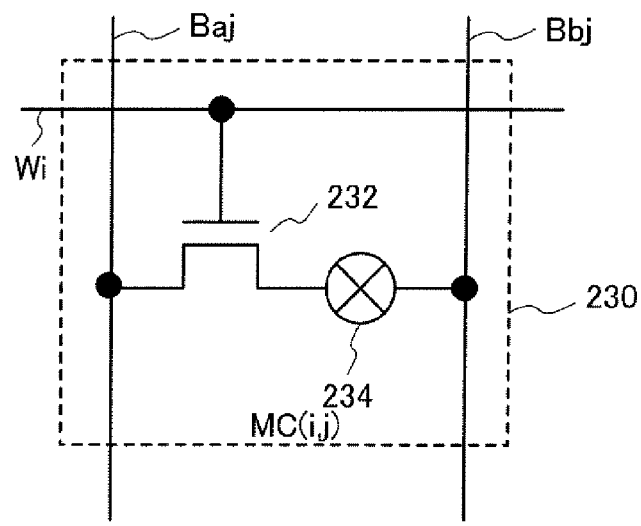

Next, FIG. 3A illustrates an example of a circuit diagram of the memory circuit 104. Further, FIG. 3B illustrates a circuit diagram of a memory cell included in the memory circuit 104.

The memory circuit 104 includes a bit line driver circuit 122, a word line driver circuit 124 and a memory cell array 126. FIG. 3A illustrates an example of the memory cell array 126 in which (m×n) memory cells ((MC (1, 1) to MC(m, n)) are arranged in matrix so as to be m memory cells in column and n memory cells in row.

Each memory cell (typically, MC (i, j) is considered) (i is an integer of greater than or equal to 1 and less than or equal to m and j is an integer of greater than or equal to 1 and less than or equal to n) includes a thin film transistor 232 and an antifuse 234. A gate electrode of the thin film transistor 232 is connected to a word line Wi, one of a source electrode and a drain electrode of the thin film transistor 232 is connected to a first bit line Baj, and the other of the source electrode and the drain electrode of the thin film transistor 232 is connected to one of an anode and a cathode of the antifuse 234. The other of the anode and the cathode of the antifuse 234 is connected to a second bit line Bbj.

The first bit line Baj and the second bit line Bbj connected to the memory cell MC (i, j) into/from which data is written/read are selected by the bit line driver circuit 122. Further, the word line Wi connected to the memory cell MC (i, j) into/from which data is written/read is selected by the word line driver circuit 124. The first bit line Baj, the second bit line Bbj and the word line Wi, which are selected, are connected to the writing circuit 102 at the time of writing operation and connected to the reading circuit 106 at the time of reading operation The bit line driver circuit 122 and the word line driver circuit 124 each include a selector circuit, and the like.

One of the first writing circuit 114 and the second writing circuit 116 is selected depending on which one of "0" and "1" of binary data is written at the time of writing operation. The first writing circuit 114 or the second writing circuit 116, which is selected, performs writing to the selected memory cell MC (i, j)i At the time of reading operation, the selected memory cell MC (i, j) is connected to the reading circuit 106 and reading is performed.

One feature of the structure of the memory according to the present invention is to have the first writing circuit 114 which writes one of "0," and "1" of binary data and the second writing circuit 116 which writes the other of "0" and "1" of binary data as compared to normal write-once memory. That is, the first writing circuit 114 writes "0" of binary data and the second writing circuit 116 writes "1" of binary data. Alternatively, the first writing circuit 114 writes "1" of binary data and the second writing circuit 116 writes "0" of binary data. Hereinafter, in this embodiment mode, the description will be made with an assumption that the first writing circuit 114 writes "0" and the second writing circuit 116 writes "1".

"0" or "1" of binary data is written so as to correspond to electrical characteristics of the antifuse 234 included in the memory cell MC (i, j).

In general, when an antifuse is applied to a memory element, "0" and "1", or "1" and "0" are assigned to a high resistance state which is an initial state (a state where writing voltage is not applied) and a low resistance state which is a writing state (a state where writing voltage is applied). As an example of wiring operation in the case where "0" is assigned to an initial state and "1" is assigned to the writing state, writing voltage is applied selectively to a memory cell into which "1" is written and the state of an antifuse included in the memory cell is changed to a low resistance state (a writing state). On the other hand, writing voltage is not applied to a memory cell into which "0" is written, and an antifuse included in the memory cell remains in an initial state. Writing voltage is applied by the writing circuit. That is, writing into the memory cell to which "1" is recorded is performed by the writing circuit and writing into the memory cell to which "0" is recorded is not performed. "0" or "1" can be written into each memory cell depending on whether an antifuse included in each memory cell is in an initial state or in a writing state. As a result of this, data can be written as binary data.

In memory of this embodiment mode, data writing is performed in blocks and it is distinguished in blocks whether or not data has been written. One feature of the memory of this embodiment mode is that "0" and "1" are assigned to two different writing states of antifuses in a block where data has been written. The antifuse has an element structure in which the state of the antifuse is changed from an initial state to one of the two writing states to which 0" and "1" are assigned. That is, in this embodiment mode, data writing into the memory cells included in the memory circuit 104 is performed in blocks and it is distinguished in blocks whether or not data has been written. In each of the memory cells in a block where data has been written, an antifuse in one of the two writing states is provided.

The entire memory cell array having the memory cells included in the memory circuit 104 may be regarded as one block or may be divided into a plurality of blocks. There is no particular limitation on a method for distinguishing blocks or memory cells as long as it can be distinguished whether or not data has been written. As a distinguishing method, a flag, a physical switch or the like can be used. For example, a flag is set to a block where the data has been written, and it is detected in blocks whether or not the flag is set. When it is detected that the flag is set, it can be judged that data has been written into the block. When it is detected that the flag is not set, it can be judged that data has not been written into the block. A specific memory cell in a block may be assigned to the flag. When data has been written, writing into an antifuse included in the specific memory cell may be performed. By performing writing into the flag of a block where data has been written, a flag "1" is set, while a block where data has not been written remains as it is (remains in an initial state). Thus, it can be distinguished whether or not data has been written. Alternatively, when a physical switch is used, for example, a switch which is provided in a block where data has been written is damaged and it may be distinguished in blocks whether or not data has been written by detecting whether or not the switch is damaged. Needless to say, a flag or a switch is set in each memory cell instead of being set in a block and it may be distinguished whether or not data has been written.

In the present invention, an initial state of electrical characteristics of an antifuse is referred to as "a first state" and two different writing states are referred to as "a second state" and "a third state". The antifuse applied to the memory of this embodiment mode is in one state selected from "the first state" which is an initial state, "the second state" which is a writing state, or "the third state" which is a writing state. Further, the memory of this embodiment mode is provided with antifuses each having an element structure where the state of the antifuse is changed from "the first state" to "the second state" or "the third state". Note that writing into the memory is performed in blocks and it is distinguished in blocks whether or not the data has been written In a block where data has been written, "0" and "1" or "1" and "0" are assigned to an antifuse in "the second state" and an antifuse in "the third state", and no antifuse in "the first state" is present. That is, in a block where data has been written, the antifuse in "the second state" or the antifuses in "the third state" are inevitably provided. Hereinafter, in this embodiment mode, in a block where data has been written, "0" is assigned to "the second state" of the antifuse and "1" is assigned to "the third state" of the antifuse.

Next, an example of a circuit operation in the case of writing "0" into the memory cell MC (i, j) and an example of a circuit operation in the case of writing "1" into the memory cell MC (i, j) will be described with reference to FIGS. 6A and 6B. Note that a thin film transistor 232a may be an n-channel thin film transistor or a p-channel thin film transistor; however, in this embodiment mode, the description will be made with an assumption that the thin film transistor 232a is an n-channel thin film transistor. An electrical characteristic of the antifuse 234 before writing is "the first state".

Figure 6A:
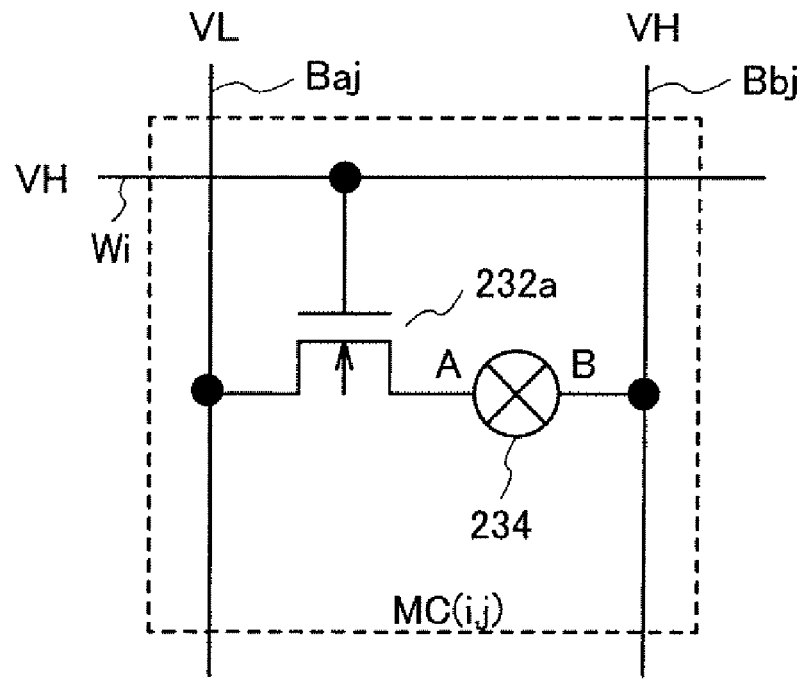
FIGS. 6A and 6B are views each illustrating an example of a circuit operation at the time of data writing.

FIG. 6A illustrates an example of the case of writing "0" into the memory cell MC (i, j). For example, the voltage of the first bit line Baj is set to be VL and the voltage of the second bit line Bbj and the word line Wi is set to be VH, and the thin film transistor 232a of the memory cell MC (i, j) is turned on. As a result of this, VL is supplied from a point A side to the antifuse 234, VH is supplied from a point B side to the antifuse 234 and VH-VL is applied to the antifuse 234, so that the state of the antifuse 234 is changed to "the second state".

Figure 6B:
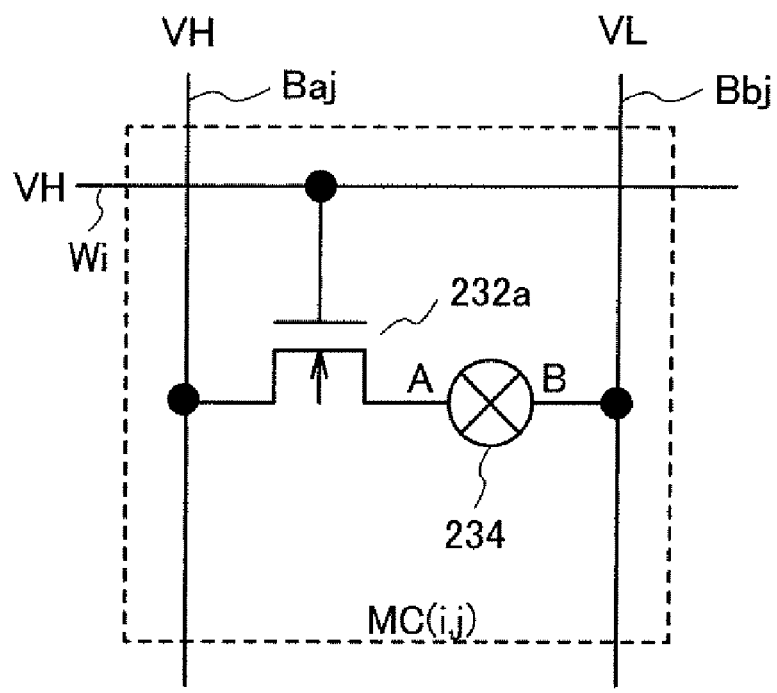

FIG. 6B illustrates an example of the case of writing "1" into the memory cell MC (i, j). For example, the voltage of the first bit line Baj and the word line Wi is set to be VH and the voltage of the second bit line Bbj is set to be VL, and the n-channel thin film transistor 232a of the memory cell MC (i, j) is turned on. As a result of this, VH is supplied to a point A side of the antifuse 234, VL is supplied from a point B side to the antifuse 234 and VH-Vth-VL is applied to the antifuse 234, so that the state of the antifuse 234 is changed to "the third state".

Note that in this specification, VH>VL is satisfied. VH-Vth-VL corresponds to a writing voltage (Vwrite) and is a voltage which changes a resistance state of the antifuse 234. Further, in this embodiment mode, VGND≧VL (here, VGDN=0V) is satisfied. Note that Vth is a threshold of the thin film transistor 232a. Writing data into the antifuse is performed by application of a writing voltage (Vwrite) to an insulating region of the antifuse. Dielectric breakdown occurs in the insulating region of the antifuse to which the writing voltage (Vwrite) is applied and an upper electrode and a lower electrode of the antifuse are short-circuited, so that the resistance value of the antifuse is changed.

The antifuse 234 can obtain one of two different writing states depending on whether VH is supplied to the point B side or the point A side. In the case of FIG. 6A, a voltage is applied so that an electric potential at the point B side is higher than an electric potential at the point A side. In the case of FIG. 6B, a voltage is applied so that an electric potential at the point A side is higher than an electric potential at the point B side. When a writing voltage is applied to the antifuse 234, by controlling a direction of the voltage applied to the antifuse 234, the two different writing states can be obtained. The direction of the voltage applied to the antifuse 234 indicates that the voltage is applied so that an electric potential at the point B side is higher than an electric potential at the point A side or an electric potential at the point A side is higher than an electric potential at the point B side. Here, by reversing a direction of the voltage applied to the antifuse 234, the two different writing states are obtained. Each of the two writing states obtained here corresponds to "the second state" or "the third state".

As to writing operation into the memory, writing into the memory cell to which "0" is to be written, as illustrated in FIG. 6A, is performed by the first writing circuit 114, so that the state of the antifuse included in the memory cell is changed to "the second state". On the other hand, writing into the memory cell into which "1" is to be written, as illustrated in FIG. 6B, is performed by the second writing circuit 116, so that the state of the antifuse included in the memory cell is changed to "the third state". The state of an antifuse included in each memory cell is changed to "the second state" or "the third state", as appropriate, whereby "0" or "1" can be written into the memory cell. As a result of this, the data input to the memory 100 can be written as binary data.

The memory 100 may have a structure in which it has only one block and only one data is written. However, the memory 100 preferably has a structure in which it is divided into a plurality of blocks and a plurality of data can be written, By dividing into the plurality of blocks, data can be written additionally as needed. Note that one block may include a plurality of memory cells or a single memory cell.

Figure 4:
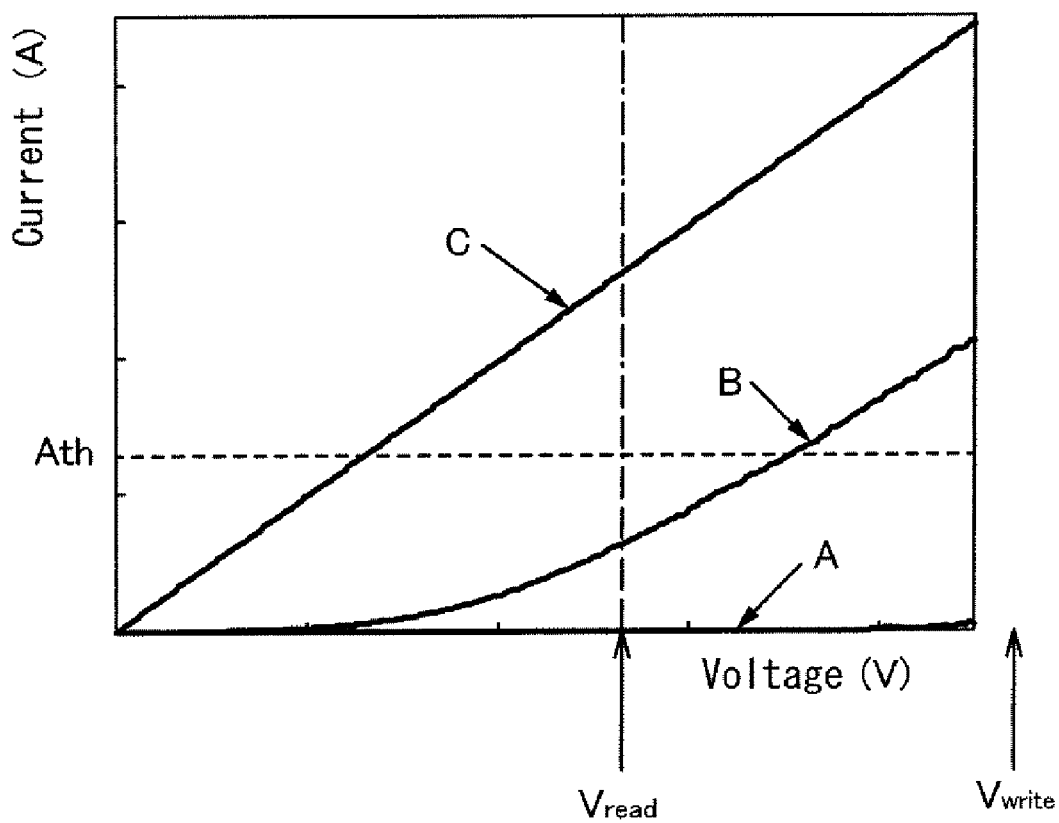
FIG. 4 is a schematic view showing electrical characteristics of an antifuse of the present invention.

Here, "the first state", "the second state" and "the third state" which are electrical characteristics of the antifuse are considered. FIG. 4 shows an example of the current-voltage characteristics (hereinafter, also referred to as "I-V characteristics") of "the first state", "the second state" and "the third state" of the antifuse. A horizontal axis represents a voltage applied to the antifuse and a vertical axis represents a current flowing through the antifuse at that time. Note that FIG. 4 shows I-V characteristics in the range of less than or equal to the writing voltage (Vwrite).

FIG. 4 shows a mode A, a mode B and a mode C. The mode A shows a high resistance state where little current flows even when a given voltage is applied. The mode C shows a low resistance state where a current flows in proportion to a applied voltage. The mode B shows a high resistance state where little current flows when a voltage of less than a predetermined voltage is applied and shows a low resistance state where current flows well when a voltage of greater than or equal to a predetermined voltage is applied. The mode B shows a lower resistance state than the mode A and shows a higher resistance state than the mode C. The mode A shows a high resistance state regardless of the level of the applied voltage and corresponds to "the first state" which is an initial state of the antifuse. The mode B and the mode C correspond to "the second state" and "the third state" of the antifuse. In this embodiment mode, the mode B and the mode C correspond to "the second state" and "the third state", respectively. Accordingly, when the voltage applied to the antifuse is less than or equal to the writing voltage, and the electric resistance of the antifuse in "the first state" is R1, the electric resistance of the antifuse in "the second state" is R2, and the electric resistance of the antifuse in "the third state" is R3, R1>R2>R3 is satisfied.

In a block where data has been written, binary data is assigned to "the second state" and "the third state" of the antifuse. A threshold voltage Vth or a threshold current Ath is set between "the second state" and "the third state" and binary data may be assigned with the threshold voltage Vth or the threshold current Ath used as a boundary.

Reading data can be set as appropriate by a practitioner and a method using a current, a method using a voltage, or the like can be used. For example, as shown in FIG. 4, a threshold current Ath is set between the mode C of "the third state" and the mode B of "the second state". When a current is greater than or equal to the threshold current Ath, "1" of binary data is assigned, and when a current is less than the threshold current Ath, "0" of the binary data is assigned. By comparing a current which flows in applying a reading voltage with the threshold current Ath, the binary data can be read, For example, when a current of greater than or equal to the threshold current Ath is obtained, "1" can be read, and when a current of less than the threshold current Ath is obtained, "0" can be read. Alternatively, it can be judged which of the binary data is assigned by setting a threshold voltage Vth using the threshold current Ath and comparing the threshold voltage Vth with a voltage output by application of the reading voltage.

In this embodiment mode, a block where data has been written is detected. In the block where data has been written, reading of "0" is performed when the antifuse is in "the second state" showing the mode B, and reading of "1" is performed when the antifuse is in "the third state showing the mode C".

Note that "0" or "1" may be assigned to "the first state" showing the mode A in a block where data has not been written. That is, in a block where data has not been written, one of binary data may be assigned to an initial state where a writing voltage is not applied. Alternatively, data other than "0" or "1" may be assigned to "the first state", so that reading of the data may be performed separately as "the first state".

Writing data into the antifuse is performed by application of a writing voltage to an insulating region of the antifuse. Dielectric breakdown occurs in the insulating region of the antifuse to which the writing voltage is applied and the upper electrode and the lower electrode of the antifuse are short-circuited, so that the resistance value of the antifuse is changed. That is, the state of the antifuse is changed by occurrence of dielectric breakdown of the antifuse. "The second state" and "the third state" of the antifuse are writing states where writing has been performed by applying a writing voltage to the antifuse in "the first state" which is an initial state and short-circuiting the antifuse. Accordingly, the change of "the first state"→"the second state" and the change of "the first state"→"the third state" are irreversible. "The second state" is a writing state where the upper electrode and the lower electrode of the antifuse have been short-circuited and writing has been performed. Even when the writing voltage is applied to the antifuse in "the second state" again, writing data into the antifuse in "the second state" cannot be performed. Therefore, the state of the antifuse in "the second state" cannot be changed to "the third state" or "the first state". Further, "the third state" is a writing state where the upper electrode and the lower electrode of the antifuse have been short-circuited and writing has been performed. Even when the writing voltage is applied to the antifuse in "the third state" again, writing data into the antifuse in "the third state" cannot be performed. Therefore, the state of the antifuse in "the third state" cannot be changed to "the second state" or "the first state".

That is, one feature of the present invention is to use, as a memory element, an antifuse having a characteristic that a change such as the change of "the first state"→"the second state" or the change of "the first state"→"the third state" occurs while a change such as the change of "the second state"→"the first state", the change of "the third state"→"the first state", the change of "the second state"→"the third state" or the change of "the third state"→"the second state" does not occur. In other words, the antifuse in "the second state" has a characteristic that the state is not changed even when writing is performed. Further, the antifuse in "the third state" has a characteristic that the state is not changed even when writing is performed. Needless to say, the change to "the second state" and the change to "the third state" do not occur as long as a voltage is not applied. Note that "the first state"→"the second state" means a change from a state on the left side of an arrow to a state on the right side of the arrow. "The second state" of the antifuse can be obtained in such a manner that writing into the memory cell including the antifuse in "the first state" is performed by the first writing circuit. Further, "the third state" of the antifuse can be obtained in such a manner that writing into the memory cell including the antifuse in "the first state" is performed by the second writing circuit.

Figure 5:
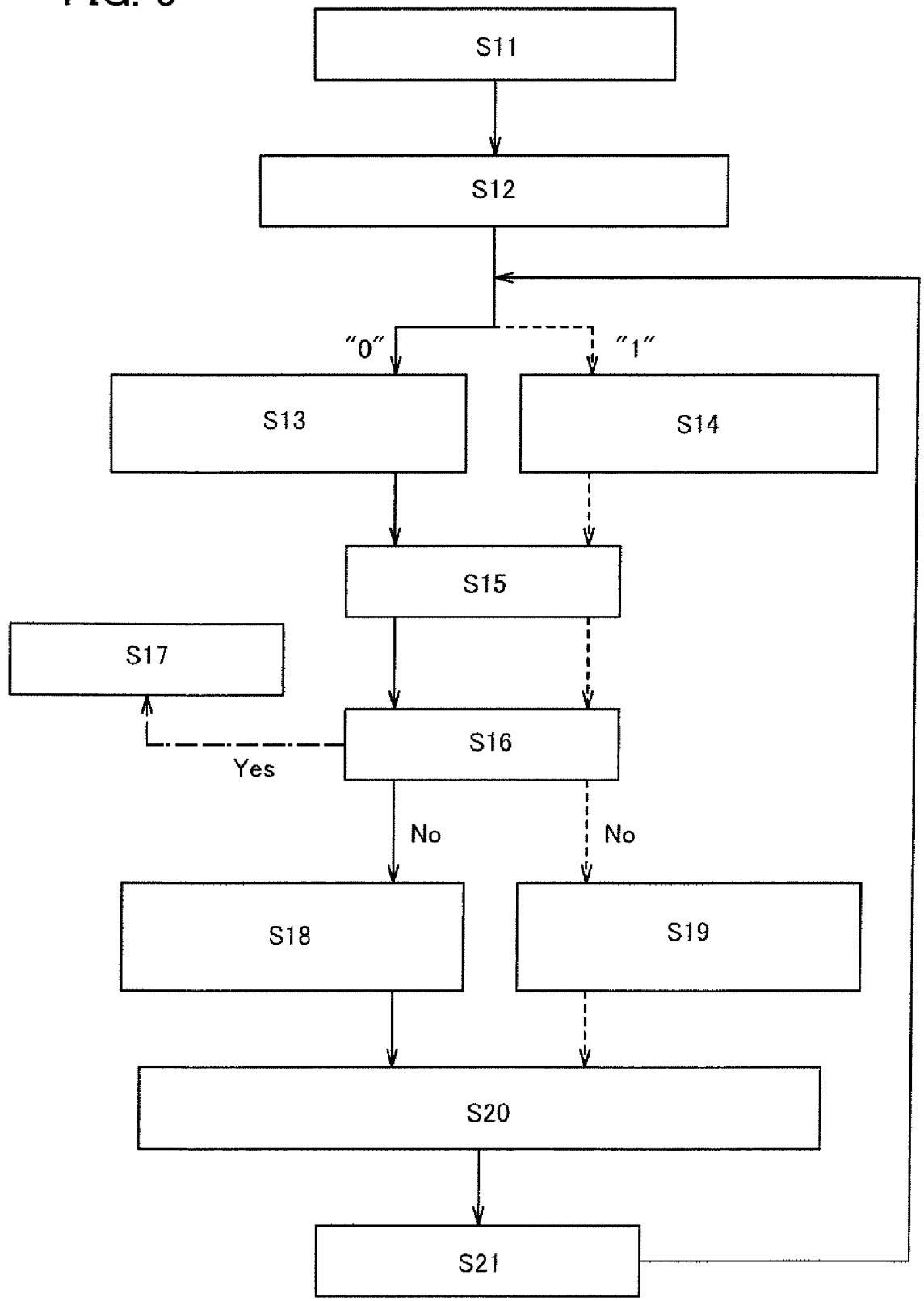
FIG. 5 is a flow chart showing an example of a method of writing data into the semiconductor device of the present invention.

Next, an example of a method for writing data to the memory of this embodiment mode will be described with reference to FIG. 1, FIGS. 3A and 3B, and FIG. 5. FIG. 5 is a flow chart showing an example of a series of writing operations.

First, data is input to the memory 100 (S11). The data input to the memory 100 is converted into the binary data (S12). Then, the binary data is written into the memory circuit 104.

First, the case of writing "0" will be described. The first writing circuit 114 is selected from the writing circuit 102. The selected first writing circuit 114 and the memory circuit 104 are connected to each other (S13). Next, the memory cell MC (i, j) into which "0" is written is selected (S15). Here, an example in which writing into MC (1,1) is performed will be described. It is detected whether or not a block where the selected memory cell MC (1,1) is placed is a block where data has been written (S16). In the case where data has not been written into the block in (S16) (or the case of "No", that is, the case where data has not been written), a writing voltage is applied to the selected memory cell MC (1,1) by the first writing circuit 114 (S18). Specifically, the voltage of the first bit line Ba1 is set to be VL and the voltage of the second bit line Bb1 and the word line W1 is set to be VH, and the thin film transistor 232 is turned on and a writing voltage is applied to the antifuse 234. As a result of this, the electrical characteristic of the antifuse 234 is changed to "the second state". Note that when the antifuse 234 included in the selected memory cell MC (1,1) is not in "the first state", the electrical characteristic of the antifuse 234 is not changed even when writing operation is performed.

Next, the case of writing "1" will be described. The second writing circuit 116 is selected from the writing circuit 102 and the second writing circuit 116 and the memory circuit 104 are connected to each other (S14). Next, the memory cell MC (i, j) into which "1" is written is selected (S15). Here, an example in which writing into a memory cell MC (2,1) is performed will be described. It is detected whether or not a block where the selected memory cell MC (2,1) is placed is a block where data has been written (S16). In the case where data has not been written into the block in (S16) (or the case of "No", that is, the case where data has not been written), a writing voltage is applied to the selected memory cell MC (2,1) by the second writing circuit 116 (S19). Specifically, the voltage of the first bit line Ba1 and the word line W2 is set to be VH and the voltage of the second bit line Bb1 is set to be VL, and the thin film transistor 232 is turned on and a writing voltage is applied to the antifuse 234. As a result of this, the electrical characteristic of the antifuse 234 is changed to "the third state". Note that when the antifuse 234 included in the selected memory cell MC (2,1) is not in "the first state", the electrical characteristic of the antifuse 234 is not changed even when writing operation is performed.

As described above, writing operation of "0" or "1" is finished (S21). When writing into the other memory cell 230 is performed after the writing operation, the steps from selection of the first writing circuit 114 or the second writing circuit 116 may be performed again. Note that in the case where data has been written into the block in (S16) (in the case of "Yes"), an error code which means that data has been written is detected (S17) and writing operation is not performed. When data writing has been finished in a given block, a mark which means that data has been written is put in the block (S20) and writing operation is finished (S21).

Note that a flow chart shown in FIG. 5 is an example and is not limited thereto. For example, after selection of a block where the data has not been written, a memory cell which is placed in the block where data has not been written is selected and writing operation may be performed. Alternatively, after selection of a block where data has not been written and putting in the block the mark which means that data has been written, writing operation to the block may be performed. Data writing and distinguishing whether or not data has been written may be performed in memory cells (or in antifuses).

Further, reading operation will also be described. A block (a memory cell or an antifuse) where data has been written is detected and the data written into the block is read. Specifically, binary data of the memory cell which is placed in the block where the data has been written is read and the data written into the block is read. Here, an example in which binary data written into a memory cell MC (2, 2) is read will be described.

When binary data written into the memory cell MC (2,2) is read, for example, a first bit line Ba2 is connected to the reading circuit 106. The voltage of a second bit line Bb2 and a word line W2 is set to be Vrh and the thin film transistor 232 is turned on. Note that Vrh is selected so that the thin film transistor 232 is turned on even when the antifuse 234 is in "the second state" or "the third state". Vrh corresponds to a reading voltage.

A voltage (an output voltage) output from the first bit line Ba2 through the transistor 232 is read. When the output voltage is greater than or equal to the threshold voltage Vth, reading of "1" is performed as data written into the memory cell MC (2,2). On the other hand, when the output voltage is less than the threshold voltage Vth, reading of "0" is performed as the data written into the memory cell MC (2,2).

In this manner, binary data can be written into a given memory cell MC (i, j) which is placed in a block where data has not been written and binary data written into the given memory cell MC (i, j) which is placed in the block where the data has been written can be read.

As described above, the memory of this embodiment mode is provided with a plurality of antifuses each of which is in one state selected from "the first state", "the second state", or "the third state" as memory elements, writing into the antifuse is performed in blocks and it is distinguished in blocks whether or not the data has been written. The antifuse has an element structure in which the state is changed from "the first state" to "the second state" or "the third state". In a block where data has been written, the antifuse which is placed in the block is inevitably in "the second state" or "the third state", binary data are written using "the second state" and "the third state" and data writing is performed in blocks. The antifuse in "the second state" is an element the state of which cannot be changed to "the first state" or "the third state". Further, the antifuse in "the third state" is an element the state of which cannot be changed to "the second state" or "the first state". Accordingly, by assigning binary data to "the second state" and "the third state", in a block where data has been written, "0" and "1" of binary data can be physically non-rewritable. That is, rewriting data which has been written once into the memory of the present invention is impossible, so that falsification of data can be prevented.

Note that the memory of the present invention may be ROM which is provided with only blocks where all the antifuses are in "the second state" or "the third state" by writing and where data has been written before shipment. Alternatively, the memory of the present invention may be write-once read-many memory where antifuses in "the first state" are present. The state of the antifuse in "the first state" is changed to "the second state" or "the third state" by selecting the first writing circuit or the second writing circuit and performing writing as appropriate, so that "0" or "1" can be written. Accordingly, write-once read-many memory where data can be written additionally as needed can be realized. In the case of memory provided with antifuses in "the first state", all the antifuses may be in "the first state" at the time of shipment or the memory may include a block where data has been written and a block where data has not been written. In any case, the memory of the present invention can have a structure in which new data is written additionally and rewriting data which has been written once is impossible, so that falsification of data can be prevented.

Note that this embodiment mode can be freely combined with any of the other embodiment modes and embodiments.

Embodiment Mode 2

In Embodiment Mode 1 described above, an example is described in which the n-channel thin film transistor 232a is used as the transistor 232 of the memory cell MC (i, j). In this embodiment mode, an example will be described in which a p-channel thin film transistor 232b is used. Note that the other structures follow those of Embodiment Mode 1 and the description thereof is omitted here.

Figure 9A:
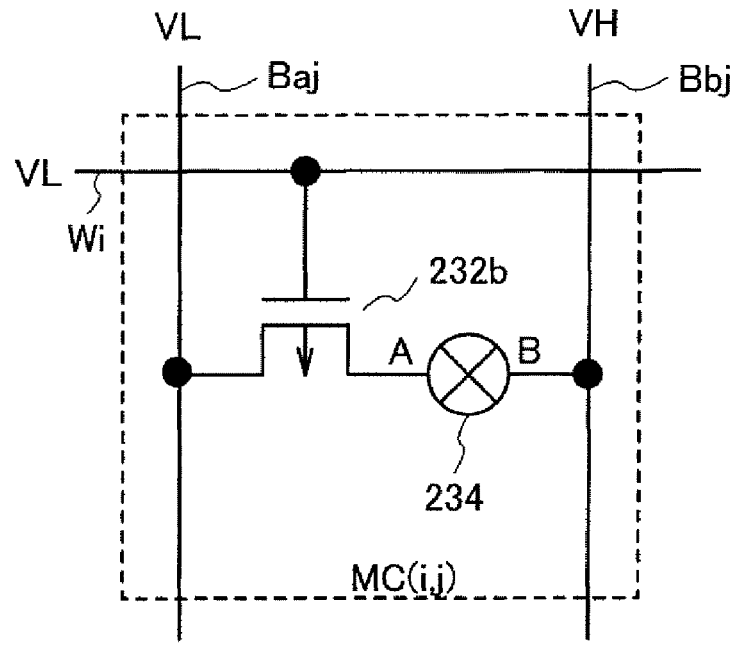
FIGS. 9A and 9B are views each illustrating an example of a circuit operation at the time of data writing.

FIG. 9A illustrates an example in which "0" is written into a memory cell MC (i, j). For example, the voltage of a first bit line Baj and a word line Wi is set to be VL and the voltage of a second bit line Bbj is set to be VH, and the p-channel thin film transistor 232b is turned on. VL is supplied to a point A side of the antifuse 234, VH is supplied to a point B side of the antifuse 234 and VH-VL is applied to the antifuse 234, so that the state of the antifuse 234 is changed to "the second state".

Figure 9B:
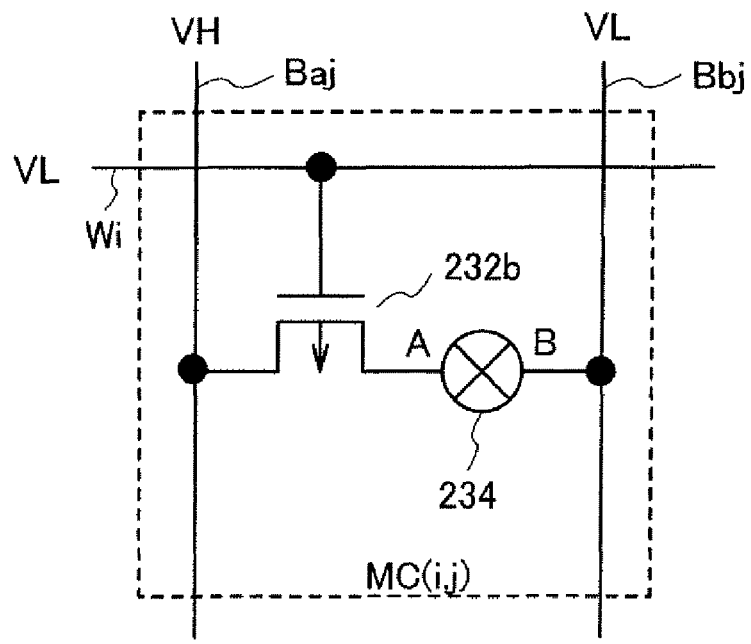

FIG. 9B illustrates an example of the case of writing "1" into the memory cell MC (i, j). For example, the voltage of a first bit line Baj is set to be VH and the voltage of a second bit line Bbj and a word line Wi is set to be VL, and the p-channel thin film transistor 232b is turned on. VH is supplied to a point A side of the antifuse 234, VL is supplied to a point B side of the antifuse 234 and VH-VL is applied to the antifuse 234, so that the state of the antifuse 234 is changed to "the third state".

The state of the antifuse 234 is changed to one of two different writing states depending on whether VH is supplied to the point A side or whether VH is supplied to the point B side. That is, by reversing a direction of the voltage applied to the antifuse 234, the two different writing states are obtained. The two writing states which are obtained are "the second state" and "the third state". "The second state" and "the third state" can be obtained by reversing a direction of the voltage applied to an antifuse having one element structure, which is in "the first state". By changing the state of the antifuse to "the second state" or "the third state" as appropriate, "0" or "1" can be written into the memory cell, so that data can be written into memory.

Note that this embodiment mode can be freely combined with any of the other embodiment modes and embodiments.

Embodiment Mode 3

In this embodiment mode, an example of a memory circuit having a structure different from that described in Embodiment Mode 1 will be described. Note that a structure except the memory circuit follows that described in Embodiment Mode 1.

Figure 7A:
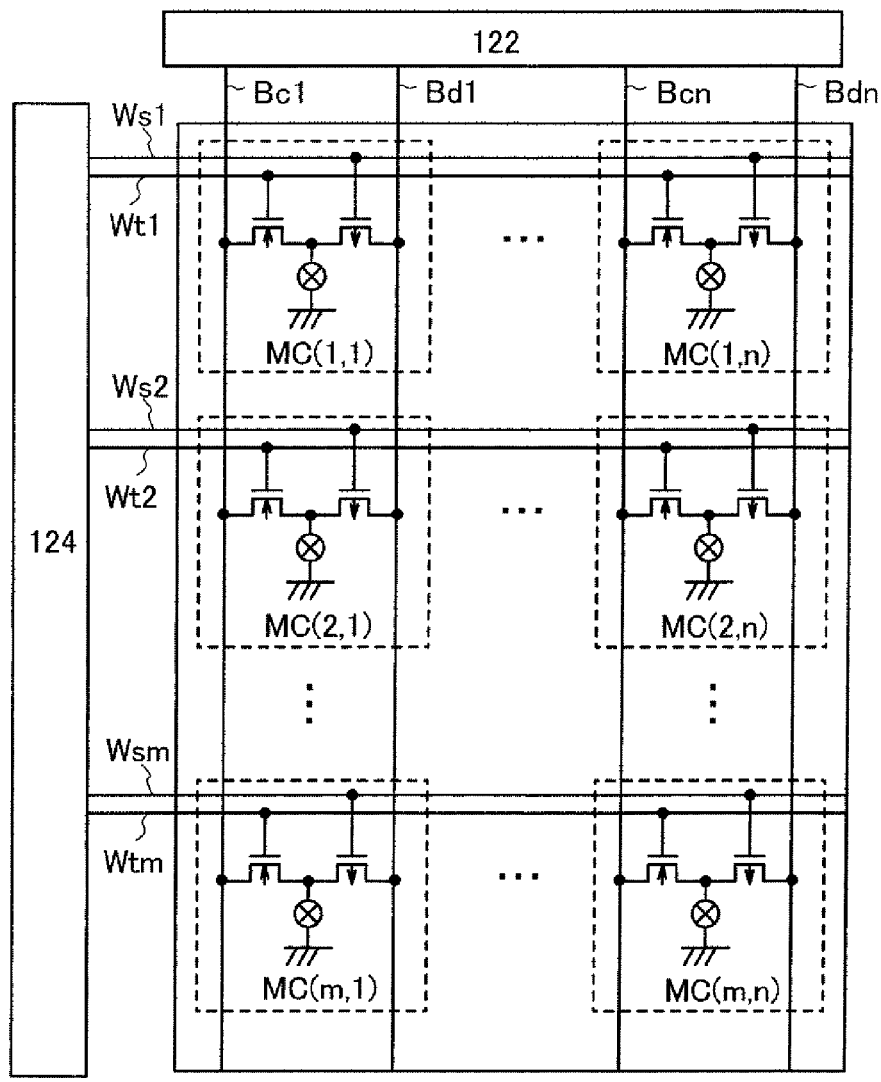
FIGS. 7A and 7B are circuit diagrams illustrating an example of the memory circuit and the memory cell of the present invention, respectively.
Figure 7B:
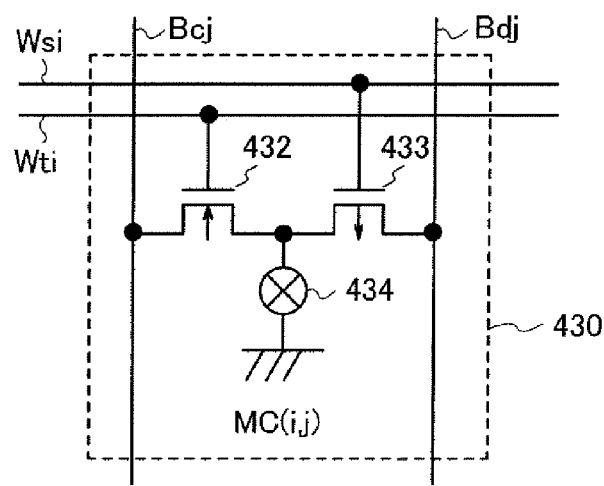

FIG. 7A illustrates an example of a circuit diagram of a memory circuit 104 which is different from that described in Embodiment Mode 1. In addition, FIG. 7B illustrates a circuit diagram of a memory cell. The memory circuit 104 illustrated in FIG. 7A includes a bit line driver circuit 122, a word line driver circuit 124 and a memory cell array 126 as in FIG. 3A. Further, FIG. 7A illustrates an example of the memory cell array 126 in which (m×n) memory cells ((MC (1, 1) to MC(m, n)) are arranged in matrix so as to be m memory cells in column and n memory cells in row.

Each memory cell (typically, a MC (i, j) is considered) (i is an integer of greater than or equal to 1 and less than or equal to m and j is an integer of greater than or equal to 1 and less than or equal to n) includes an n-channel thin film transistor 432, a p-channel thin film transistor 433 and an antifuse 434.

A gate electrode of the n-channel thin film transistor 432 is connected to a second word line Wti, one of a source electrode and a drain electrode of the n-channel thin film transistor 432 is connected to a first bit line Bcj, the other of the source electrode and the drain electrode of the n-channel thin film transistor 432 is connected to one of a source electrode and a drain electrode of the p-channel thin film transistor 433 and one of an anode and a cathode of the antifuse. A gate electrode of the p-channel thin film transistor 433 is connected to a first word line Wsi, one of the source electrode and the drain electrode of the p-channel thin film transistor 433 is connected to one of the source electrode and the drain electrode of the n-channel thin film transistor 432 and one of the anode and the cathode of the antifuse 434, and the other of the source electrode and the drain electrode of the p-channel thin film transistor 433 is connected to a second bit line Bdj. Further, one of the anode and the cathode of the antifuse 434 is connected to one of the source electrode and the drain electrode of the n-channel thin film transistor 432 and one of the source electrode and the drain electrode of the p-channel thin film transistor 433 and the other of the anode and the cathode of the antifuse 434 is grounded.

Further, the first bit line Bcj and the second bit line Bdj are provided in parallel to each other. The first word line Wsi and the second word line Wti are provided in parallel to each other. The first bit line Bcj or the second bit line Bdj and the first word line Wsi or the second word line Wti are provided to be orthogonal.

The first bit line Bcj and the second bit line Bdj which are connected to the memory cell MC (i, j) into/from which data is written/read are selected by the bit line driver circuit 122. Further, the first word line Wsi and the second word line Wti which are connected to the memory cell MC (i, j) into/from which data is written/read are selected by the word line driver circuit 124. The first bit line Bcj, the second bit line Bdj, the first word line Wsi and the second word line Wti which are selected are connected to the writing circuit 102 illustrated in FIG. 1 at the time of writing operation, and connected to the reading circuit 106 at the time of reading operation.

Note that as in Embodiment Mode 1, into the memory of this embodiment mode, one of "0" and "1" of binary data is written by the first writing circuit 114 and the other of "0" and "1" of binary data is written by the second writing circuit 116. "0" or "1" of binary data is fixed to correspond to electrical characteristics of the antifuse 434 included in the memory cell MC (i, j) into which data has been written. In this embodiment mode as well, the antifuse 434 is in one state selected from "the first state", "the second state", or "the third state" showing the mode A, the mode B and the mode C, respectively which are shown in FIG. 4 of Embodiment Mode 1 described above. Further, the antifuse 434 has an element structure in which the state is changed from "the first state" to "the second state" or "the third state". Data writing is performed in blocks (or in memory cells). A block where data has been written is provided with the antifuse in "the second state" showing the mode B or the antifuse in "the third state" showing the mode C. In a block where data has been written, "0" of binary data is assigned to "the second state" and "1" of binary data is assigned to "the third state".

Next, an example of a circuit operation in the case of writing "0" into the memory cell MC (i, j) and an example of a circuit operation in the case of writing "1" into the memory cell MC (i, j) will be described with reference to FIGS. 8A and 8B. Note that an electrical characteristic of the antifuse 434 before writing is "the first state" in Embodiment Mode 1 described above.

Figure 8A:
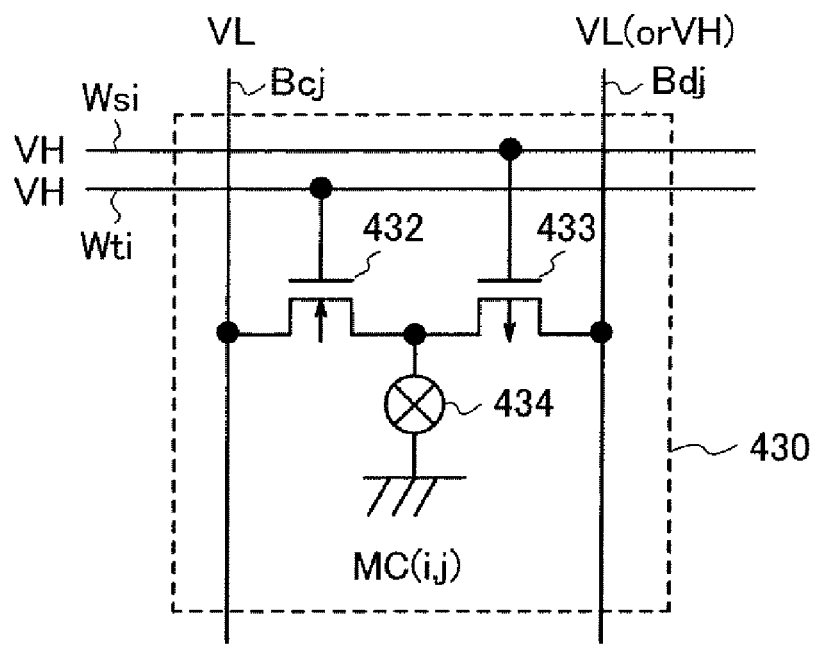
FIGS. 8A and 8B are views each illustrating an example of a circuit operation at the time of data writing.

FIG. 8A illustrates an example of the case of writing "0" into the memory cell MC (i, j). For example, the voltage of the first bit line Bcj is set to be VL and the voltage of the first word line Wsi and the second word line Wti is set to be VH, and the n-channel thin film transistor 432 of the memory cell MC (i, j) is turned on and the p-channel thin film transistor 433 is turned off. As a result of this, VL is supplied to the antifuse 434 and VL-VGND is applied to the antifuse 434, whereby the state of the antifuse 434 is changed to "the second state". Note that although the voltage of the second bit line Bdj may be set to be VL or VH, it is preferably set to be VL. In any case, the p-channel thin film transistor 433 is turned off.

Figure 8B:
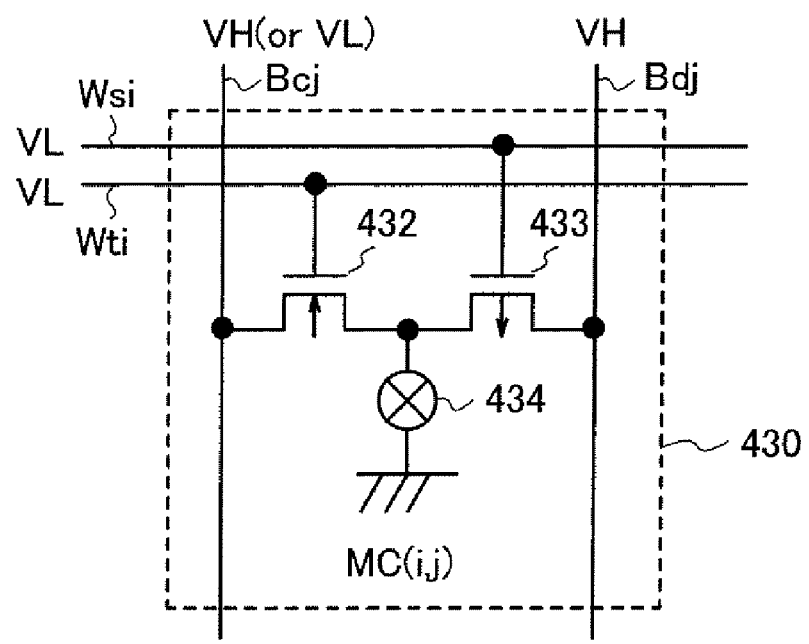

FIG. 8B illustrates an example of the case of writing "1" into the memory cell MC (i, j). For example, the voltage of the second bit line Bdj is set to be VH and the voltage of the first word line Wsi and the second word line Wti is set to be VL, and the p-channel thin film transistor 433 of the memory cell MC (i, j) is turned on and the n-channel thin film transistor 432 is turned off. As a result of this, VH is supplied to the antifuse 434 and VH-VGND is applied to the antifuse 434, whereby the state of the antifuse 434 is changed to "the third state". Note that although the voltage of the first bit line Bcj may be set to be VH or VL, it is preferably set to be VH. In any case, the n-channel thin film transistor 432 is turned off.

Note that in this embodiment mode, VH>VGND>VL is satisfied. Further, "VH-VGND" or "VL-VGND" corresponds to a writing voltage and changes the resistance state of the antifuse 434.

In the memory cell array of this embodiment mode, the n-channel thin film transistor 432 and the p-channel thin film transistor 433 are combined and selectively turned on, whereby "VH-VGND" or "VL-VGND" can be applied to the antifuse 434. In the antifuse 434, one of two different writing states can be obtained depending on whether "VI-VGND" is applied to the antifuse 434 or whether "VL-VGND" is applied to the antifuse 434. The two writing states obtained here are "the third state" which is obtained in the case of applying "VH-VGND", and "the second state" which is obtained in the case of applying "VL-VGND".

Data writing into the memory of this embodiment mode is performed in blocks (or in memory cells) and binary data is written into memory cells included in a block to which data is to be written. A block into which data is to be written is a block where data has not been written. In the block where data has not been written, writing into the memory cell into which "0" is to be written is performed by the first writing circuit 114 as illustrated in FIG. 8A, so that the state of the antifuse included in the memory cell is changed to "the second state". On the other hand, writing into the memory cell into which "1" is to be written is performed by the second writing circuit 116 as illustrated in FIG. 8B, so that the state of the antifuse included in the memory cell is changed to "the third state". The state of the antifuse included in each of the memory cells in a block where data has not been written is changed to "the second state" or "the third state" as appropriate, whereby "0" or "1" is written into the memory cell and data can be written. Note that after performing writing into all the memory cells included in a block where data has not been written, the block becomes a block where data has been written. A mark of distinguishing a block where data has been written from a block where data has not been written is put in the block where data has been written.

In the case of reading data which has been written into the memory cell MC (i, j) as described above, for example, the first bit line Bcj is connected to the reading circuit and the voltage of the first word line Wsi is set to be Vrh so that the n-channel thin film transistor 432 is turned on. Further the voltage of the first word line Wsi and the second hit line Bdj is set to be Vrl so that the p-channel thin film transistor 433 is turned off. A voltage is read from the first bit line Bcj through the n-channel thin film transistor 432. Note that the memory cell MC (i, j) is arranged in a block where data has been written.

Here, each of the antifuses included in the memory of this embodiment mode shows one of the mode A, the mode B and the mode C as in Embodiment Mode 1 described above and each of the antifuses placed in a block where data has been written shows the mode B or the mode C. In a predetermined reading voltage, a threshold Vth is set between the mode C and the mode B.

A voltage which is read from the first bit line Bcj in applying a predetermined reading voltage to a given memory cell MC (i, j) and a threshold Vth are compared to each other. When the voltage which is read is greater than or equal to the threshold Vth, reading of "1" of binary data is performed. When the voltage which is read is less than the threshold Vth, reading of "0" of binary data is performed. In this embodiment mode, when the antifuse is in "the third state" which shows the mode C, reading of "1" is performed, and when the antifuse is in "the second state" which shows the mode B, reading of "0" is performed.

Note that as described above, "the second state" and "the third state" of the antifuses are writing states in each of which writing has been performed by applying a writing voltage to the antifuses in "the first state" which is an initial state and short-circuiting an upper electrode and a lower electrode of the antifuses. "The second state" or "the third state" is a writing state where the upper electrode and the lower electrode of the antifuse have been short-circuited and writing has been performed, and writing data into the antifuse in "the second state" or "the third state" cannot be performed even when the writing voltage is applied again. Therefore, the antifuse of this embodiment mode can have a change such as the change of "the first state"→"the second state" or the change of "the first state"→"the third state". However, the antifuse of this embodiment mode has a characteristic that it does not have a change such as the change of "the second state"→"the first state", the change of "the third state"→"the first state", the change of "the second state"→"the third state", or the change of "the third state"→"the second state". That is, the antifuse in "the second state" is an element the state of which cannot be changed to "the third state" or "the first state". Further, the state of the antifuse in "the third state" is an element the state of which cannot be changed to "the second state" or "the first state".

Accordingly, a physically non-rewritable memory can be realized as follows: the n-channel thin film transistor 432 and the p-channel thin film transistor 433 are selectively turned on, a voltage is applied to the antifuse so that the antifuse is in "the second state" or "the third state" and binary data is assigned to "the second state" or "the third state". That is, rewriting data which has been written once into the memory of the present invention is impossible, so that falsification of data can be prevented. Further, by providing the antifuse in "the first state" in the memory, new data can be written additionally as appropriate. Accordingly, a non-rewritable memory in which data can be written additionally can be provided.

Note that this embodiment mode can be freely combined with any of the other embodiment modes and embodiments.

Embodiment Mode 4

Figure 16:
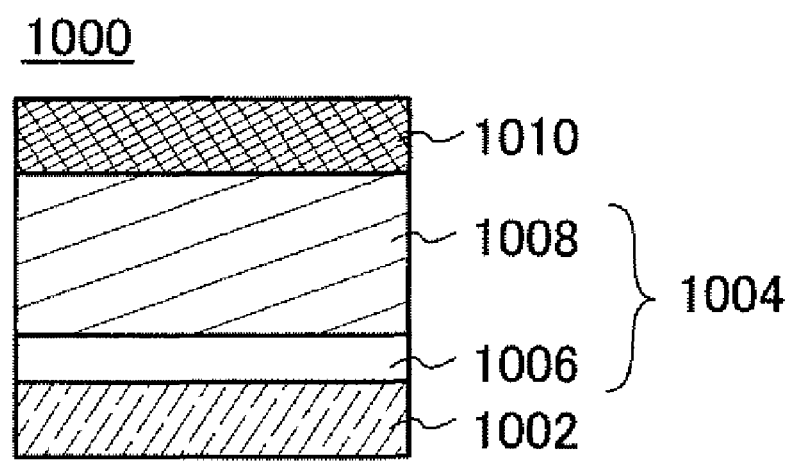
FIG. 16 is a cross-sectional view illustrating an example of an element structure of the antifuse of the present invention.

In this embodiment mode, an example of an antifuse which can be used as a memory element of a semiconductor device of the present invention will be described. FIG. 16 is a cross-sectional schematic view of an antifuse which can be applied to the present invention.

FIG. 16 is a cross-sectional schematic view of an antifuse 1000. The antifuse 1000 has a structure in which a resistant material layer 1004 is interposed between a first electrode 1002 and a second electrode 1010. The antifuse 1000 is in one state selected from "a first state", "a second state" or "a third state" which show the mode A, the mode B and the mode C, respectively, which are shown in FIG. 4 of Embodiment Mode 1 described above. Further, the antifuse 1000 has an element structure in which the state is changed from "the first state" to "the second state" or "the third state". Note that the antifuse 1000 at the time of manufacture is in the "the first state" showing the mode A. Hereinafter, a specific structure of the antifuse 1000 and a manufacturing method thereof will be described.

First, the first electrode 1002 is formed. The first electrode 1002 is formed using a substance such as tungsten, titanium, aluminum, nickel, chromium, molybdenum, tantalum, cobalt, zirconium, vanadium, palladium, hafnium, platinum, iron, or the like; an alloy containing one or a plurality of the materials; or a compound containing one or a plurality of the materials. A conductive layer is formed Using the above-described material by an evaporation method, a sputtering method, a printing method, a plating method, or the like, and then the conductive layer is selectively etched, a whereby it can be processed into a desired shape.

Next, the resistant material layer 1004 is formed over the first electrode 1002. As the resistant material layer 1004, a layer the state of which can be changed from a high resistance state to a low resistance state by an electric signal may be formed. In this embodiment mode, an insulating layer 1006 is formed over the first electrode 1002, and a silicon layer 1008 is formed over the insulating layer 1006.

The insulating layer 1006 is formed by a CVD method, a sputtering method, an ALD method, or the like using silicon oxide, silicon nitride, silicon oxynitride, silicon nitride oxide, or the like. Alternatively, the insulating layer 1006 can be also formed by performing surface treatment on the first electrode 1002. As surface treatment, oxidation treatment, nitridation treatment, oxynitridation treatment, or the like can be given. The thickness of the insulating layer 1006 is 1 nm to 20 nm, preferably about 1 nm to 15 nm.

The silicon layer 1008 is formed using a material containing silicon as its main component by a CVD method, a sputtering method, or the like. Further, a crystal structure of the silicon layer 1008 may be any of amorphous silicon, microcrystalline silicon and polycrystalline silicon, and a plurality of crystal structures may be mixed. The thickness of the silicon layer 1008 is 1 nm to 200 nm, preferably about 5 nm to 100 nm.

Note that when amorphous silicon is used as the silicon layer 1008, amorphous silicon containing hydrogen (hereinafter, also referred to as "hydrogenated amorphous silicon") can be also used. Here, "hydrogenated amorphous silicon" means amorphous silicon with a hydrogen content of greater than or equal to 2 atomic %, preferably about greater than or equal to 2 atomic % to less than or equal to 20 atomic %. By using hydrogenated amorphous silicon as the resistant material layer, it can be thought that short circuiting between electrodes by a silicide reaction can be caused easily. Hydrogen can be contained in such hydrogenated amorphous silicon at the time of deposition. Alternatively, hydrogen can be added in another step to be contained after deposition. For example, by deposition in a gas containing hydrogen by a plasma CVD method, hydrogenated amorphous silicon can be formed. At this time, the hydrogen content of the hydrogenated amorphous silicon can be adjusted by appropriately setting deposition conditions (a gas composition, a gas pressure, a gas atompsphere, a gas flow rate, a temperature of a chamber, a substrate temperature, applied power, or the like). Alternatively, amorphous silicon not containing much hydrogen is formed by an LPCVD method, or the like, and then hydrogen can be added to be contained in the amorphous silicon by an ion implantation method or an ion doping method.

Next, the second electrode 1010 is formed over the resistance material layer 1004. The second electrode 1010 may be formed using the same material as that of the first electrode 1002. Specifically, the second electrode 1010 may be formed using a substance such as tungsten, titanium, aluminum, nickel, chromium, molybdenum, tantalum, cobalt, zirconium, vanadium, palladium, hafnium, platinum, iron, or the like; an alloy containing one or a plurality of the materials; or a compound containing one or a plurality of the materials. As a manufacturing method thereof after forming a conductive layer by an evaporation method, a sputtering method, a printing method, a plating method, or the like, the conductive layer is selectively etched, whereby it may be processed into a desired shape. Further, the second electrode 1010 may be formed using the same material as the first electrode 1002 or using the different material from the first electrode 1002.

The antifuse 1000 can be in one of "the second state" and "the third state" which are writing states different from each other and which are changed from "the first state" which is an initial state. The electric resistances of the two writing states are different from each other, and the two writing states can be obtained by performing writing operation by the writing circuit corresponding to each state. Further, the state of the antifuse 1000 which has been changed once to the writing state is not changed to the other state even when further writing operation is performed by the writing circuit. Specifically, the writing state which is "the second state" is not changed to "the third state" or "the first state". Further, the writing state which is "the third state" is not changed to "the second state" or "the first state". Accordingly, by using the antifuse described in this embodiment mode as a memory element, a non-rewritable memory where data can be written additionally can be realized.

Note that this embodiment mode can be freely combined with any of the other embodiment modes and embodiments.

Embodiment Mode 5

This embodiment mode describes a step for manufacturing a semiconductor device provided with antifuse type memory according to the present invention, with reference to FIGS. 10A and 10B. Here, an example is described in which a radio chip which is a semiconductor device which performs communication by radio is manufactured.

Specifically, an example of manufacturing a radio chip including an antenna portion 394 for receiving or transmitting a radio signal; a memory portion 392 where data is written; and a driver circuit portion 390 in which various kinds of circuits such as a circuit for writing data into the memory portion 392, a circuit for reading data written into the memory portion 392, a circuit for analyzing a signal received by the antenna portion 394, and a circuit for producing power from a received signal are integrated is described. Elements such as a thin film transistor included in the driver circuit portion 390 and an antifuse included in the memory portion 392, and an antenna included in the antenna portion 394 are sealed with a substrate or a sheet which is formed using a flexible material.

Further, radio chips as an example of the present semiconductor devices may be separately manufactured over separate substrates, or may be obtained by division into individual chips as appropriate after a plurality of radio chips is manufactured at one time using a large-area substrate. Note that a cross-sectional structure shown in FIG. 10A is a process diagram in the middle of manufacturing the present semiconductor device. Further, although circuits using thin film transistors are integrated in the driver circuit portion 390, FIGS. 10A and 10B illustrate cross-sectional views each including two thin film transistors for convenience. Similarly, although memory includes a plurality of antifuses in the memory portion 392, FIGS. 10A and 10B illustrate cross-sectional views each including one antifuse for convenience.

First, a separation layer 304 and an insulating layer 306 are stacked in this order over a substrate 302. As the substrate 302, a substrate having an insulating surface such as a quartz substrate, a glass substrate, or the like is used. As the separation layer 304, a tungsten layer with a thickness of 50 nm to 200 nm is formed. As the insulating layer 306, a silicon oxide layer is formed. Note that as the separation layer 304, a metal layer such as a molybdenum layer or a titanium layer as well as the tungsten layer given above; a stacked structure of the metal layer, and a metal oxide (for example, tungsten oxide) layer or a metal nitride (for example, tungsten nitride) layer; an amorphous silicon layer; or the like can be used. As the insulating layer 306, a silicon nitride layer, a silicon oxynitride layer, or a silicon nitride oxide layer as well as the silicon oxide layer, or a stacked film of these layers can be used. In the case where a metal layer such as a tungsten layer is formed as the separation layer 304 and an oxide layer such as a silicon oxide layer or a silicon oxynitride layer is formed as the insulating layer 306, a layer including metal oxide of metal used for the separation layer may be formed between the metal layer and the oxide layer. Similarly, in the case where a nitride layer such as a silicon nitride layer or a silicon nitride oxide layer is formed as the insulating layer 306, a layer including metal nitride of metal used for the separation layer may be formed between the metal layer and the nitride layer.

Then, a semiconductor layer 305 and a semiconductor layer 307 are formed over the insulating layer 306. An amorphous silicon layer formed over an entire surface by a CVD method or a sputtering method is crystallized to obtain a polysilicon layer, then the polysilicon layer is selectively etched, whereby the semiconductor layer 305 and the semiconductor layer 307 can be formed. As a method for crystallizing the amorphous silicon layer, a laser crystallization method, a thermal crystallization method using rapid thermal annealing (RTA) or an annealing furnace; a crystallization method using a metal element that promotes crystallization; a method combining these methods; or the like can be used. Note that as the semiconductor layer 305 and the semiconductor layer 307, microcrystalline silicon or single crystal silicon may be used. Further, in order to control a threshold voltage of a thin film transistor to be completed later, a small amount of impurity elements (impurity elements imparting either n-type conductivity or p-type conductivity) may be added to the semiconductor layer 305 and the semiconductor layer 307. Note that the semiconductor layer 305 and the semiconductor layer 307 form channel formation regions of thin film transistors to be formed later. In order to realize high-speed driving of a driver circuit, a semiconductor layer having a crystal structure is preferably used for the semiconductor layer which forms a channel formation region of a thin film transistor. By realizing high-speed driving of the driver circuit, data in memory can be read at high speed.

Then, a gate insulating layer 308 is formed over the semiconductor layer 305 and the semiconductor layer 307. As the gate insulating layer 308, a silicon oxide layer or a silicon oxynitride layer with a thickness of 1 nm to 200 nm is formed by a CVD method or a sputtering method. Alternatively, the gate insulating layer 308 can be formed by subjecting the semiconductor layer 305 and the semiconductor layer 307 to surface oxidation treatment or surface nitridation treatment which uses plasma excited by a microwave. Further alternatively, the gate insulating layer 309 can be formed by forming an insulating layer over the semiconductor layer 305 and the semiconductor layer 307, and then subjecting the insulating layer to surface oxidation treatment or surface nitridation treatment.

Then, a gate electrode 310 which overlaps with the semiconductor layer 305 with the gate insulating layer 308 interposed therebetween, and a gate electrode 312 which overlaps with the semiconductor layer 307 with the gate insulating layer 308 interposed therebetween are formed. Further, a first electrode 314 which functions as one of the electrodes of the antifuse is formed in the same step as the gate electrode 310 and the gate electrode 312. The gate electrode 310, the gate electrode 312, and the first electrode 314 are formed using a substance such as tungsten, titanium, aluminum, nickel, chromium, molybdenum, tantalum, cobalt, zirconium, vanadium, palladium, hafnium, platinum, or iron, or an alloy or a compound of these. Specifically, the gate electrode 310, the gate electrode 312, and the first electrode 314 may be formed by forming a conductive layer using the above-described material by a sputtering method, and then processing the conductive layer into a desired shape. Here, a material is selected which has both a property suitable for a gate electrode of the thin film transistor and a property suitable for an electrode of the antifuse. In this embodiment mode, a tungsten layer is formed as the gate electrode 310, the gate electrode 312, and the first electrode 314.

Then, an impurity element is added to the semiconductor layer 305 and the semiconductor layer 307. Here, impurity elements imparting different conductivity types are added to the semiconductor layer 305 and the semiconductor layer 307. Specifically, an impurity element imparting n-type conductivity is added to the semiconductor layer 305, and an impurity element imparting p-type conductivity is added to the semiconductor layer 307. For the impurity element imparting n-type conductivity, phosphorus (P), arsenic (As), or the like is used. For the impurity element imparting p-type conductivity, boron (B), aluminum (Al), gallium (Ga), or the like is used. Further, the impurity element may be added by an ion implantation method or an ion doping method.

A first resist mask which covers the semiconductor layer 307 is formed, and an impurity element imparting n-type conductivity is added to the semiconductor layer 305 with the first resist mask and the gate electrode 310 used as masks. In the semiconductor layer 305, a channel formation region 316 and a pair of n-type impurity regions 318 are formed in a self-aligned manner with the gate electrode 310 used as a mask. The n-type impurity regions 318 each function as a source region or a drain region.

Then, the first resist mask which covers the semiconductor layer 307 is removed. After a second resist mask which covers the semiconductor layer 305 is formed, an impurity element imparting p-type conductivity is added to the semiconductor layer 307 with the second resist mask and the gate electrode 312 used as masks. In the semiconductor layer 307, a channel formation region 320 and a pair of p-type impurity regions 322 are formed in a self-aligned manner with the gate electrode 312 used as a mask. The p-type impurity regions 322 each serve as a source region or a drain region. Then, the second resist mask which covers the semiconductor layer 305 is removed. Note that although an example is described in which an impurity element imparting n-type conductivity is added in advance, there is no particular limitation on the addition order of impurity elements.

Further, a low-concentration impurity region which functions as an LDD region may be formed in the semiconductor layer 305 and the semiconductor layer 307. The low-concentration impurity region is formed between the channel formation region and the impurity region that functions as a source region or a drain region. For example, before an impurity element is added to the semiconductor layer, a sidewall insulating layer is formed on a side surface of the gate electrode. The sidewall insulating layer is used as a mask in adding an impurity element, whereby a low-concentration impurity region can be formed to be adjacent to the channel formation region. Of course, a tow-concentration impurity region can be formed by utilizing a resist mask which is newly formed for formation of a low-concentration impurity region. By providing a low-concentration impurity region serving as an LDD region, an electric field near a drain region can be alleviated, whereby deterioration due to hot carrier injection can be prevented.

Then, activation of the impurity elements added to the semiconductor layer 305 and the semiconductor layer 307, or hydrogenation of the semiconductor layer is performed. The activation of the impurity elements and the hydrogenation of the semiconductor layer are performed by irradiation with a laser beam, thermal treatment using an annealing furnace or RTA, or the like. Therefore, the gate electrode 310, the gate electrode 312, and the first electrode 314 are formed of a material which can withstand a treatment temperature for the activation of the impurity elements and the hydrogenation of the semiconductor layer. Note that, in this embodiment mode, the gate electrode 310, the gate electrode 312, and the first electrode 314 are formed using a tungsten layen Tungsten is high-melting-point metal, and thus, tungsten can fully withstand a treatment temperature for the activation and the hydrogenation.

Next, an interlayer insulating layer 324 which covers the gate electrode 310, the gate electrode 312, and the first electrode 314 is formed. The interlayer insulating layer 324 is formed using an inorganic insulating material such as silicon oxide, silicon nitride, silicon oxynitride, or silicon nitride oxide by a sputtering method, a CVD method, or the like. Note that the interlayer insulating layer 324 may have a single layer structure or a stacked structure. Further, the interlayer insulating layer 324 also functions as a partition which insulates adjacent antifuses.

Alternatively, the interlayer insulating layer 324 can be formed using a siloxane resin which can be formed by a coating method and has high heat resistance. Note that the siloxane resin corresponds to resin including a Si—O—Si bond. Siloxane is composed of a skeleton formed by the bond of silicon (Si) and oxygen (O). An organic group (such as an alkyl group and an aryl group) or a fluoro group may be used as a substituent. A fluoro group may be included in the organic group.

Next, the interlayer insulating layer 324 and the gate insulating layer 308 are selectively etched to form openings. In the etching, a position where an opening will not be formed may be covered with a resist mask. Further, the etching may be performed by a dry etching method or a wet etching method, or may be performed by combining these etching methods. After the etching, the resist mask which is no longer needed is removed. Here, an opening reaching the impurity region 318 formed in the semiconductor layer 305, an opening reaching the impurity region 322 formed in the semiconductor layer 307, and openings reaching the first electrode 314 are formed. As the openings reaching the first electrode 314, a first opening where a resistance material layer and a second electrode of the antifuse are to be formed later and a second opening where a wiring which is electrically connected to the first electrode 314 is to be formed are formed. Further, although not shown, openings reaching the gate electrode 310 and the gate electrode 312 are formed. The first opening reaching the first electrode 314, which is formed in this etching step, has a diameter of its bottom surface of about 1 μm to 6 μm. However, the first opening is preferably small because consumption current is increased as the diameter of the first opening is larger. Note that although the size of the opening is indicated by a diameter, the shape of a top surface of the opening is not limited to round, and ellipse or rectangle may also be employed.

The openings reaching the semiconductor layers, the openings reaching the gate electrodes, and the openings reaching the first electrode can be formed in one-time etching by controlling an etching condition as appropriate.

The resistance material layer is formed to cover the first opening reaching the first electrode 314. Here, as the resistance material layer, a stacked structure of a silicon oxynitride layer 326 and an amorphous silicon layer 328 is formed. The silicon oxynitride layer 326 is formed to a thickness of 1 nm to 20 nm, preferably 1 nm to 15 nm, by a CVD method or a sputtering method. The amorphous silicon layer 328 is formed to a thickness of 1 nm to 200 nm, preferably 5 nm to 100 nm, by a CVD method or a sputtering method. Note that as the resistance material layer, a layer the state of which is changed from a high resistance state to a low resistance state by application of an electric signal may be formed and have a single layer structure or a stacked-layer structure.

Next, after a conductive layer is formed over an entire surface of the substrate by a sputtering method, the conductive layer is selectively etched to form a conductive layer 330, a conductive layer 332, and a conductive layer 334. Further, a second electrode 338 functioning as the other of the electrodes of the antifuse formed in the memory portion 392, a third electrode 336, and a connection electrode 340 of the antenna portion 394, are formed in the same step as the conductive layer 330, the conductive layer 332, and the conductive layer 334. The conductive layers 330, 332, and 334 function as source electrodes and drain electrodes of thin film transistors formed in the driver circuit portion 390. Note that the conductive layer 332 also functions as a wiring which electrically connects the semiconductor layer 305 and the semiconductor layer 307. The connection electrode 340 formed in the antenna portion 394 is an electrode which electrically connects an antenna and a power supply formation circuit to be formed later.

The conductive layer which forms the conductive layers 330, 332, and 334, the third electrode 336, the second electrode 338, and the connection electrode 340 may be formed from a material selected from the above-described materials for the gate electrodes as appropriate. Here, a three-layer structure is formed in which a titanium layer with a thickness of 50 nm to 200 nm, an aluminum layer with a thickness of 100 nm to 400 nm, and a titanium layer with a thickness of 50 nm to 200 nm are stacked. The titanium layer which forms the second electrode 338 is in contact with the amorphous silicon layer 328 which forms the resistance material layer.

The third electrode 336 formed in the memory portion 392 is electrically connected to the first electrode 314 and a wiring is led, whereby consuming power is reduced. In the case of active-type memory, the third electrode 336 functions to electrically connect the first electrode 314 and a switching element which controls the antifuse (for example, a thin film transistor). In the case of passive-type memory, the first electrodes 314 may be arranged in parallel in a stripe form (strip form) and the second electrodes 338 may be arranged in parallel in a stripe form so as to be perpendicular to the first electrodes 314. In the case of passive-type memory, the third electrode 336 is made to function as a lead out electrode by being provided in an end portion of the first electrode 314.

In this embodiment mode, an example is described in which the conductive layers 330, 332, and 334, the third electrode 336, the second electrode 338, and the connection electrode 340 are formed to have a stacked-layer structure of a titanium layer and an aluminum layer. By using a titanium layer for the conductive layer forming the conductive layers 330, 332, and 334, the third electrode 336, the second electrode 338, and the connection electrode 340, a contact resistance with other conductive materials can be low. Further, by using an aluminum layer for the conductive layer forming the conductive layers 330, 332, and 334, the third electrode 336, the second electrode 338, and the connection electrode 340, a wiring resistance can be low. Since the conductive layers 330, 332, and 334, the third electrode 336, the second electrode 338, and the connection electrode 340 are also used as lead wirings of the driver circuit portion and the memory portion, and a connection portion of the antenna portion, respectively, it is useful to use the stacked-layer structure of a titanium layer and an aluminum layer, which can lower a contact resistance and a wiring resistance.

Through the above-described steps, an n-channel thin film transistor 331 and a p-channel thin film transistor 333 are formed in the driver circuit portion 390. The n-channel thin film transistor 331 and the p-channel thin film transistor 333 which are formed in the driver circuit portion 390 are electrically connected to each other via the conductive layer 332, and the n-channel transistor 331 and the p-channel transistor 333 form a CMOS circuit. Note that in the driver circuit portion 390, as well as the thin film transistors, a resistor, a capacitor, or the like may be concurrently manufactured.

In the memory portion 392, an antifuse 339 is formed. In the antifuse 339, a stacked structure of the silicon oxynitride layer 326 and the amorphous silicon layer 328 is interposed as the resistance material layer between a pair of electrodes including the first electrode 314 and the second electrode 338, where the first electrode 314 is formed in the same step as the gate electrode 310 and the gate electrode 312 of the thin film transistors and the second electrode 338 is formed in the same step as the conductive layers 330, 332, and 334 which function as source electrodes and drain electrodes of the thin film transistors.

Then, an insulating layer 342 is formed to cover the conductive layers 330, 332, and 334, the third electrode 336, the second electrode 338, and the connection electrode 340. The insulating layer 342 may be formed to have a single layer or a stack by using an inorganic insulating material or an organic insulating material, or by combining these materials.

Then, the insulating layer 342 is selectively etched to form openings. In the etching, a position where an opening is not formed may be covered with a resist mask. The etching may be performed by a dry etching method or a wet etching method, or may be performed by combining these etching methods. After the etching, the resist mask which is no longer needed is removed. Here, an opening reaching the third electrode 336 which is electrically connected to the first electrode 314 formed in the memory portion 392, and an opening reaching the connection electrode 340 formed in the antenna portion 394, are formed Note that in order to ensure electrical connection with the antenna to be formed later, the diameter of the opening reaching the connection electrode 340 is made comparatively large or a plurality of openings reaching the connection electrode 340 is provided. After the etching, the resist mask which is no longer needed is removed.

Then, a conductive layer 346 is formed to cover the opening reaching the connection electrode 340. By forming the conductive layer 346, the adherence between the antenna to be formed later and the connection electrode 340 can be improved. Further, a conductive layer 344 is formed to cover the opening reaching the third electrode 336. The conductive layer 346 and the conductive layer 344 can be formed in the same step, and can be formed using titanium, copper, aluminum, or the like, for example. The conductive layer 346 and the conductive layer 344 can be selectively formed in a desired position by an ink-jet method or the like, or may be formed in such a way that a conductive layer is formed over an entire surface of the substrate by a sputtering method, and then the conductive layer is selectively etched to be processed into a desired shape.

Then, an antenna 348 is formed over the conductive layer 346 formed in the antenna portion 394. A structure from the insulating layer 306 to the antenna 348 that are formed up to here is referred to as an element layer 360.

The antenna 348 can be formed by a sputtering method, or a printing method such as a screen printing method or an ink-jet method. In the case of forming the antenna 348 by a printing method, a conductive paste where conductive particles each having a grain size of several nanometers to several tens of nanometers are dispersed in an organic resin is selectively printed, and then baking for reducing an electric resistance is performed, so that the antenna 348 is formed.

As the conductive particles, particles or dispersing nanoparticles of one or more metals selected from silver, gold, copper, nickel, platinum, palladium, tantalum, molybdenum, or titanium, or silver halide can be used. In addition, the organic resin included in the conductive paste can be one or more selected from organic resins which function as a binder, a solvent, a dispersing agent, and a coating material. Typically, an organic resin such as an epoxy resin or a silicone resin can be used. When forming the antenna 348, baking is preferably performed after the conductive paste is squeezed. For example, in the case of using a particle which includes silver as its main component (e.g., a particle size is greater than or equal to 1 nm and less than or equal to 100 nm) as a material for the conductive paste, a conductive layer functioning as the antenna 348 can be obtained by baking it with temperatures in the range of 150° C. to 300° C. to cure. Alternatively, a particle which includes solder or lead-free solder as its main component may be used as a conductive particle. In this case, it is preferable that a particle having a particle size of 20 μm or less be used. Solder and lead-free solder have an advantage such as low cost.

There is no particular limitation on the shape of the antenna 348. As a transmission method of a signal applied to the antenna 348, an electromagnetic coupling method, an electromagnetic induction method, a microwave method, or the like can be employed. The transmission method may be selected as appropriate by a practitioner in consideration of a use, and an antenna having an optimal length and shape may be provided depending on the transmission method.

In the case of employing, for example, an electromagnetic coupling method or an electromagnetic induction method (e.g., a 13.56 MHz band) as the transmission method, electromagnetic induction caused by a change in electric field density is used. Therefore, a conductive layer functioning as an antenna is formed in an annular shape (e.g., a loop antenna) or a spiral shape (e.g., a spiral antenna).

In the case where a microwave method (for example, UHF band (860 to 960 MHz band), 2.45 GHz band, or the like) is applied as the transmission method, a length or a shape of the conductive layer functioning as an antenna may be set as appropriate in consideration of a wavelength of a radio wave used for signal transmission. For example, the antenna 348 can be formed into a linear shape (e.g., a dipole antenna), a flat shape (e.g., a patch antenna), or the like. The shape of the conductive layer functioning as an antenna is not limited to the form of a line; the conductive layer functioning as an antenna may also be provided in the form of a curve, a meander, or a combination of them, in consideration of the wavelength of the electromagnetic wave.

Figure 13A:
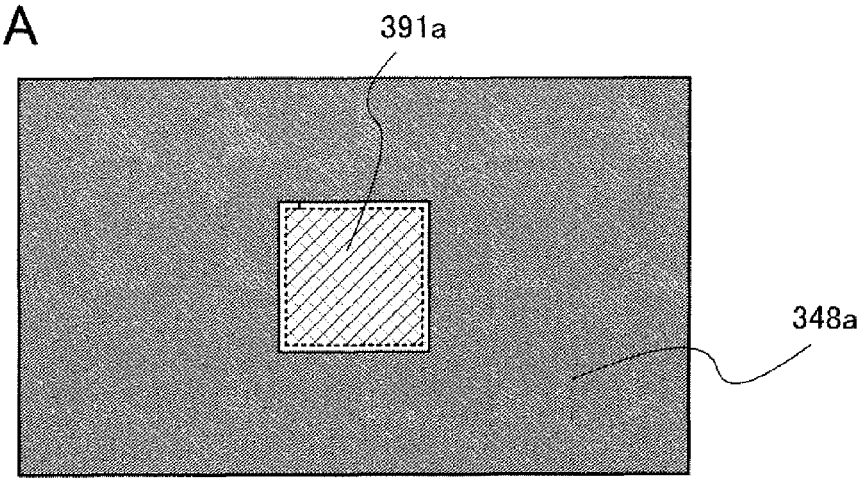
FIGS. 13A to 13E are views each illustrating an antenna that can be applied to the semiconductor device of the present invention.
Figure 13B:
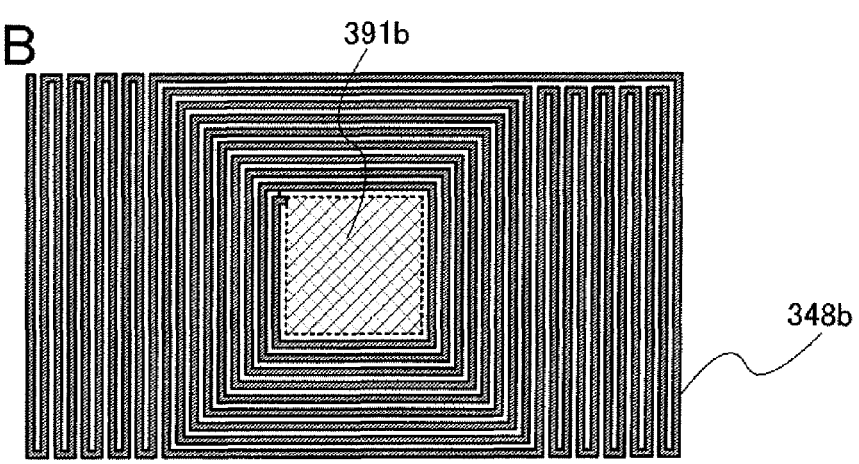
Figure 13C:
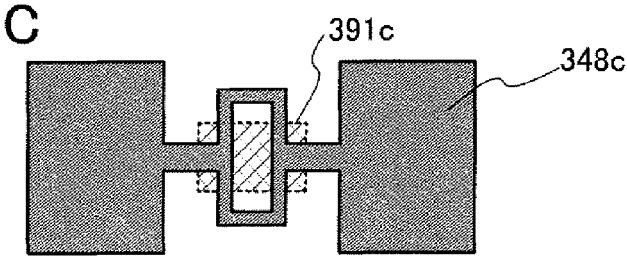
Figure 13D:
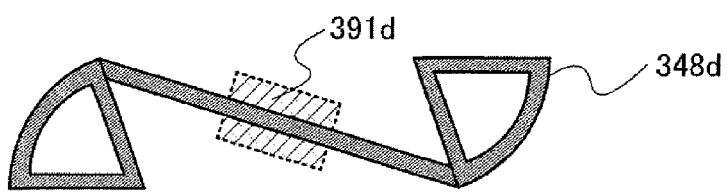
Figure 13E:
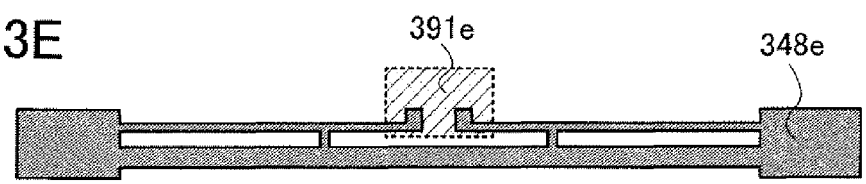

FIGS. 13A to 13E illustrate examples of a shape of the antenna. For example, as illustrated in FIG. 5A, a structure may be used in which an antenna 348a is disposed all around a driver circuit and a memory portion 391a. As illustrated in FIG. 13B, a thin antenna 348b may be provided in the area around a driver circuit and a memory portion 391b. As illustrated in FIG. 13C, the antenna may have a shape like an antenna 348c for receiving a high-frequency electromagnetic wave with respect to a driver circuit and a memory portion 391c. As illustrated in FIG. 13D, the antenna may have a shape like an antenna 348d which is 180° omnidirectional (capable of receiving signals in any direction) with respect to a driver circuit and a memory portion 391d. As illustrated in FIG. 13E, the antenna may have a shape like an antenna 348e which is extended to be long like a stick with respect to a driver circuit and a memory portion 391e. As the antenna 348 illustrated in FIGS. 10A and 10B, any of the antennas having the shapes illustrated in FIGS. 13A to 13E can be used in combination.

The appropriate length of the antenna depends on the frequency used for reception. For example, in the case where the frequency is 2.45 GHz, if a half-wave dipole antenna is provided, the antenna may have a length of about 60 mm (½ wavelength), and if a monopole antenna is provided, the antenna may have a length of about 30 mm (¼ wavelength).

Note that the driver circuit and each of the memory portions 391a to 391e collectively corresponds to a region including both the driver circuit portion 390 and the memory portion 392 which are illustrated in FIGS. 10A and 10B.

Then, separation is caused at the interface with the separation layer 304 or within the separation layer 304 which are illustrated in FIG. 10A, so that the element layer 360 is separated from the substrate 302.

Here, methods for separating the element layer 360 are listed below: (1) a method in which a stacked structure of a metal layer and a layer containing metal oxide (or metal nitride) is provided as the separation layer 304 between the substrate 302 and the element layer 360, and the layer containing metal oxide is weakened by crystallization, so that the element layer 360 is physically separated from the substrate 302; (2) a method in which a stacked structure of a metal layer and a layer containing metal oxide (or metal nitride) is provided as the separation layer 304 between the substrate 302 and the element layer 360, the layer containing metal oxide is weakened by crystallization, and part of the separation layer 304 is etched away using a solution or a halogen fluoride gas such as $NF_3$, $BrF_3$, or $ClF_3$, so that the element layer 360 is physically separated from the substrate 302; (3) a method in which the separation layer 304 is formed using amorphous silicon containing hydrogen between the substrate 302 and the element layer 360, and the separation layer 304 is irradiated with a laser beam to discharge a hydrogen gas, so that the substrate 302 is separated from the element layer 360; (4) a method in which the separation layer 304 is formed using amorphous silicon between the substrate 302 and the element layer 360, and the separation layer 304 is etched away using a solution or a halogen fluoride gas to cause separation; (5) a method in which the substrate 302 provided with the element layer 360 is mechanically shaved, or the substrate 302 is etched away using a solution or a halogen fluoride gas to cause separation; (6) a method in which an opening reaching the separation layer 304 is formed by laser beam irradiation in a position of the element layer 360 where a thin film transistor, an antifuse, an antenna, and the like are not formed, and then the element layer 360 is physically separated from a substrate 302 with the opening used as a trigger; and the like. In the above-described separation methods (1) and (2), as the metal oxide layer or the metal nitride layer, a metal oxide layer or a metal nitride layer can be used which is obtained in forming an insulating layer over a metal layer formed as the separation layer. Further, in the above-described separation method (6), the opening reaching the separation layer 304 is formed, and then part of the separation layer 304 may be etched away using a solution or a halogen fluoride gas which is introduced through the opening, and then physical separation may be performed.

As illustrated in FIG. 10B, the element layer 360 is sealed with a first sheet 350 and a second sheet 370. As the first sheet 350 and the second sheet 370, a plastic film, paper, thin ceramics, a sheet in which a textile of a carbon fiber or a glass fiber is impregnated with a resin (also referred to as a prepreg), or the like can be used. The first sheet 350 and the second sheet 370 can be bonded to each other using an adhesive layer such as an epoxy resin. By using a flexible material for the first sheet 350 and the second sheet 370 with which the element layer 360 is sealed, a semiconductor device to be obtained can be attached as a radio chip to a curved surface of an object or the like.

As the order of separation and sealing of the element layer 360, any of the following may be used: (1) the element layer 360 is separated from the substrate 302, and then the first sheet 350 is bonded to the antenna side of the element layer 360 and the second sheet 370 is bonded to the side of the element layer 360 from which the substrate 302 is separated; (2) the first sheet 350 is bonded to the antenna side of the element layer 360, and then the element layer 360 is separated from the substrate 302 and the second sheet 370 is bonded to the side of the element layer 360 from which the substrate 302 is separated; (3) before forming the antenna 348, layers from the insulating layer 306 to the conductive layers 344 and 346 are separated from the substrate 302, and then the antenna 348 is formed, and the first sheet 350 and the second sheet 370 are bonded; and the like. The order of separation and sealing of the element layer 360 can be changed by a practitioner as appropriate.

Through the above-described steps, a semiconductor device that is a radio chip can be manufactured in which an antifuse-type memory, a driver circuit including a thin film transistor, and an antenna are formed over the same substrate.

In a radio chip described in this embodiment mode, the antifuse 339 formed in the memory portion 392 is in one of selected from three states which are "the first state" which is an initial state, "the second state" which is a writing state and "the third state" which is a writing state. Of course, the antifuse 339 at the time of manufacture is in an initial state (the first state) and a writing voltage is applied to the antifuse 339 in an initial state (the first state) by the writing circuit, whereby the state of the antifuse 339 can be changed to "the second state" or "the third state" as appropriate. "The second state" and "the third state" can be obtained by performing writing data into the antifuse 339 in "the first state". "The second state" and "the third state" are writing states which are different from each other and can be obtained by performing writing by the writing circuit corresponding to each state. The electric resistances of "the first state", "the second state", and "the third state" are different from one another, and the electric resistance of "the first state" which is an initial state is the highest. The state of the antifuse in "the second state" obtained by performing writing operation into the antifuse in "the first state" is not changed to "the third state" or "the first state" even when further writing is performed. Further, the state of the antifuse in "the third state" obtained by performing writing operation into the antifuse in "the first state" is not changed to "the second state" or "the first state" even when further writing is performed. Note that as described above, the memory portion 392 includes a plurality of antifuses and data writing into the antifuses included in the memory portion 392 is performed in blocks. Further, it is distinguished in blocks whether or not data has been written into the antifuses of the memory portion 392. In a block where data has not been written, the antifuse in "the first state" is present, and in a block where data has been written, only the antifuse in "the second state" or "the third state" is present and no antifuse in "the first state" is present. In a block where data has been written, "0" and "1" of binary data are recorded to correspond to the antifuse in "the second state" and the antifuse in "the third state". As described above, even when further writing is preformed on the antifuse in "the second state", the state of the antifuse is not changed to "the third state" or "the first state". In addition, even when further writing data into the antifuse in "the third state" is preformed, the state of the antifuse is not changed to "the second state" or "the first state". Therefore, there is no concern that data written into the radio chip which is an example of the present semiconductor device is falsified. Note that in order that the state of the antifuse is changed to "the second state" or "the third state", the writing circuit may be selected as appropriate and writing operation may be performed. Further, data writing and distinguishing whether or not data has been written may be performed in memory cells.

Note that in this embodiment mode, at the state for providing memory as a radio chip, ROM may be provided where data has been written in such a manner that the state of each antifuse is changed to "the second state" or "the third state" by performing writing thereinto and "0" or "1" is fixed. Alternatively, at the stage for providing memory as a radio chip, a structure may be employed in which data is written in such a manner that the state of each antifuse is in "the first state" which is an initial state, is changed to "the second state" or "the third state" by performing writing as needed, and "0" or "1" is fixed. Further alternatively, at the state for providing memory as a radio chip, memory may be provided where there exist a block where data has not been written and a block where data has been written, into part of which data has already been written, and where data can be written additionally.

That is, a radio chip according to this embodiment mode may be a chip where data has already been written at the stage of providing the radio chip so that data can not be newly written, a chip where data is not written at all at the stage of providing the radio chip and data is newly written as needed, or a chip where data has been partly written and data is newly written as needed.

In any of the above cases, in the radio chip according to this embodiment mode, data which has been once written cannot be rewritten, so that falsification of data can be prevented.

Note that this embodiment mode can be freely combined with any of the other embodiment modes and embodiments.

Embodiment 1

In this embodiment, a method for manufacturing an active matrix semiconductor device provided with an antifuse-type memory will be described with reference to FIGS. 11 to 11D and FIGS. 12A and 12C. Here, an example is shown in which a radio chip as a semiconductor device provided with a logic circuit portion 550, a memory portion 552, and an antenna portion and power supply portion 554 over the same substrate is manufactured. Circuits including thin film transistors are integrated in the logic circuit portion 550. The memory portion 552 includes a plurality of antifuses. Note that cross sectional views of two thin film transistors included in the logic circuit portion 550, one antifuse and one thin film transistor included in the memory portion 552 and one capacitor and one thin film transistor which are included in the antenna portion and power supply portion 554 are shown for convenience.

First, a metal layer 502 serving as a separation layer is formed over a substrate 501. A glass substrate is used as the substrate 501. As the metal layer 502, a tungsten layer, a tungsten nitride layer or a molybdenum layer with a thickness of 30 nm to 200 nm which is obtained by a sputtering method is used.

Next, a surface of the metal layer 502 is oxidized to form a metal oxide layer The metal oxide layer may be formed by oxidation of the surface of the metal layer 502 with pure water or ozone water, or oxidation of the surface of the metal layer 502 with oxygen plasma. Alternatively, the metal oxide layer may be formed by heating in an atmosphere containing oxygen. Further alternatively, the metal oxide layer may be formed in a later step of forming an insulating layer serving as a separation layer which is formed over the metal layer 502. For example, when a silicon oxide layer or a silicon oxynitride layer is formed as the insulating layer by a plasma CVD method, the surface of the metal layer 502 is oxidized, so that the metal oxide layer is formed. Note that here, the metal oxide layer is not illustrated.

Next, a first insulating layer 503 is formed over the metal layer 502. An insulating layer such as a silicon oxide layer, a silicon nitride layer, or a silicon oxynitride layer is formed as the first insulating layer 503. As an example of the first insulating layer 503, a two-layer structure can be given in which a silicon nitride oxide layer having a thickness of 50 nm to 100 nm which is formed by a plasma CVD method using $SiH_4$, $NH_3$, and $N_2O$ as reactive gases, and a silicon oxynitride layer having a thickness of 100 nm to 150 nm which is formed by a plasma CVD method using $SiH_4$ and $N_2O$ as reactive gases are stacked. When the first insulating layer 503 has a stacked-layer structure, as at least one layer of the first insulating layer 503, a silicon nitride layer or a silicon oxynitride layer each having a thickness of less than or equal to 10 nm is preferably formed. Alternatively, a three-layer structure may be employed in which a silicon nitride oxide layer, a silicon oxynitride layer, and a silicon nitride layer are sequentially stacked. Although the first insulating layer 503 serves as a base insulating layer, it is not necessarily provided if it is not particularly needed. Further, a base insulating layer such as a silicon oxide layer or a silicon nitride layer may be provided between a separation layer (here, the metal layer 502) and the substrate.

Next, a semiconductor layer is formed over the first insulating layer 503. The semiconductor layer is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, a crystallization method using a metal element, such as nickel, which promotes crystallization, or the like can be used. Note that when the semiconductor layer is formed by a plasma CVD method, the first insulating layer 503 and the semiconductor layer having an amorphous structure can be successively formed without exposure to the air. The semiconductor layer is formed to a thickness of 25 nm to 80 nm (preferably 30 nm to 70 nm), Although there is no particular limitation on a material of the semiconductor layer, silicon, a silicon germanium, or the like is preferably used.

Alternatively, for crystallization treatment of the semiconductor layer having an amorphous structure, a continuous wave laser can be used. In order to obtain a crystal with a large grain size in crystallization of the semiconductor layer having an amorphous structure, it is preferable to employ second to fourth harmonics of a solid laser capable of continuous wave oscillation. Typically, the second harmonic (532 nm) or the third harmonic (355 nm) of an Nd:YVO$_4$ laser (fundamental wave of 1064 nm) may be employed. When a continuous wave laser is used, a laser beam emitted from a continuous wave YVO$_4$ laser with 10 W output is converted into a harmonic by a non-linear optical element. In addition, there is a method by which YVO$_4$ crystal and a non-linear optical element are put in a resonator and a harmonic wave is emitted. Then, the laser beam is preferably shaped into a rectangular or elliptical shape on an irradiation surface by an optical system and is emitted to the semiconductor layer (an object?). At this time, an energy density of approximately 0.01 MW/cm$^2$ to 100 MW/cm$^2$ (preferably, 0.1 MW/cm to 10 MW/cm$^2$) is needed. Then, the semiconductor layer may be moved at a speed of approximately 10 cm/sec to 2000 cm/sec relatively to the laser beam so as to be irradiated.

Note that if necessary, a small amount of an impurity element (boron or phosphorus) is added to the semiconductor layer in order to control a threshold value of a thin film transistor to be completed later. Here, boron is added by an ion doping method in which diborane (B$_2$H$_6$) is not separated by mass but excited by plasma, Next, a surface of the semiconductor layer is washed at the same time as removal of an oxide film on the surface of the semiconductor layer with an etchant containing hydrofluoric acid. Then, a second insulating layer which covers the semiconductor layer is formed. The second insulating layer is formed to a thickness of 1 nm to 200 nm by a CVD) method or a sputtering method. Preferably, an insulating layer containing silicon is formed to be as thin as 10 nm to 50 nm to have a single layer or a stacked-layer structure, and then surface nitridation treatment is performed using plasma excited by a microwave. The second insulating layer functions as a gate insulating layer of a thin film transistor to be formed later.

Note that in order to make the semiconductor layer in a region to be a capacitor later function as a conductor, an impurity element (boron or phosphorus) is added to the semiconductor layer at a high concentration. At this time, a region except the region to be the capacitor may be covered with a resist mask.

Next, gate electrodes 504, 505, 506, 507 and 508 and a first electrode 509 which serves as a lower electrode of the antifuse are formed over the second insulating layer. A conductive layer having a thickness of 100 nm to 500 nm which is obtained by a sputtering method is selectively etched and processed into a desired shape, so that the gate electrodes 504 to 508 and the first electrode 509 are obtained.

As a material of the gate electrodes 504 to 508 and the first electrode 509, a substance such as tungsten, titanium, aluminum, nickel, chromium, molybdenum, tantalum, cobalt, zirconium, vanadium, palladium, hafnium, platinum or iron; a single layer structure or a stacked-layer structure of a material selected from an alloy thereof or a compound thereof can be used. The material which reacts with silicon to form a silicide is preferably used. Note that a high melting point metal is preferably used as the gate electrode of the thin film transistor Specifically, tungsten or molybdenum can be given. In the case where the gate electrodes 504 to 508 and the first electrode 509 each have a stacked-layer structure, a material layer which serves as an upper layer may be formed using the above-described material, and a material layer which serves as a lower layer of the gate insulating layer side may be a polysilicon layer to which an impurity element such as phosphorus is added.

Next, a resist mask is formed so as to cover the semiconductor layers in regions to be p-channel thin film transistors, and an impurity element is introduced into the semiconductor layers in regions to be n-channel thin film transistors, using the gate electrodes 505, 506, 507 and 508 as masks, so that low concentration impurity regions are formed. As the impurity element, an impurity element imparting n-type conductivity or an impurity element imparting p-type conductivity can be used. As the impurity element imparting n-type conductivity, phosphorus (P), arsenic (As), or the like can be used. Here, phosphorus is introduced into the semiconductor layers in the regions to be the n-channel thin film transistors so as to be contained at concentrations of $1 \times 10^{15}$/cm$^3$ to $1 \times 10^{19}$/cm$^3$, so that n-type impurity regions are formed.

Next, the resist mask is removed. A resist mask is formed so as to cover the semiconductor layers to be the n-channel thin film transistors, and an impurity element is introduced into the semiconductor layer to be the p-channel thin film transistor, using the gate electrode 504 and the gate electrode 508 as masks, so that p-type impurity regions are formed. As the impurity element imparting p-type conductivity, boron (B), aluminum (Al), gallium (Ga), or the like can be used. Here, boron (B) is introduced into the semiconductor layer in the region to be the p-channel thin film transistor so as to be contained at concentrations of $1 \times 10^{19}$/cm$^3$ to $1 \times 10^{20}$/cm$^3$, so that the p-type impurity regions can be formed. Consequently, a channel formation region 516a and a pair of p-type impurity regions 514a, and a channel formation region 516b and a pair of p-type impurity regions 514b are formed in a self-aligned manner in the semiconductor layers in the region to be the p-channel thin film transistor The p-type impurity regions 514a and 514b each serve as a source region or a drain region.

Next, sidewall insulating layers 510 are formed on side surfaces of the gate electrodes 504 to 508 and sidewall insulating layers 511 are formed on side surfaces of the first electrode 509. A formation method of the sidewall insulating layers 510 and 511 is as follows: first, a third insulating layer is formed to have a single-layer structure or a stacked-layer structure of a layer containing silicon, an oxide of silicon, or a nitride of silicon, or a layer containing an organic material such as an organic resin by a plasma CVD method, a sputtering method, or the like so as to cover the second insulating layer, the gate electrodes 504 to 508, and the first electrode 509. Then, the third insulating layer is selectively etched by anisotropic etching mainly in a perpendicular direction to form insulating layers (the sidewall insulating layers 510 and 511) which are in contact with the side surfaces of the gate electrodes 504 to 508 and the first electrode 509, respectively. Note that part of the second insulating layer is removed by being etched at the same time as the formation of the sidewall insulating layers 510. The part of the second insulating layer is removed, so that a remaining gate insulating layer 512 is formed under each of the gate electrodes 504 to 508 and the sidewall insulating layers 510. In addition, the part of the second insulating layer is removed, so that a remaining insulating layer 513 is formed under the first electrode 509 and the sidewall insulating layers 511.

Next, a resist mask is formed so as to cover the semiconductor layers in regions to be the p-channel thin film transistors, and an impurity element is introduced into the semiconductor layers in the regions to be the n-channel thin film transistors, using the gate electrodes 505, 506, 507 and 508 and the sidewall insulating layers 510 as masks, so that high concentration impurity regions are formed. The resist mask is removed after the impurity element is introduced. Here, phosphorus (P) is introduced into the semiconductor layers in the regions to be the n-channel thin film transistors so as to be contained at concentrations of $1\times10^{19}/cm^3$ to $1\times10^{20}/cm^3$, so that n-type high concentration impurity regions can be formed. Consequently, a channel formation region 521$a$, a pair of low concentration impurity regions 519$a$ which serve as LDD regions, and a pair of high concentration impurity regions 517$a$ which serves as source or drain regions are formed in a self-aligned manner in the semiconductor layer in the region to be the n-channel thin film transistor, and a channel formation region 521$c$, a pair of low concentration impurity regions 519$c$ which serve as LDD regions, and a pair of high concentration impurity regions 517$c$ which serves as source or drain regions are formed in a self-aligned manner in the semiconductor layer in the region to be the n-channel thin film transistor. At the same time, a first impurity region 521$b$, second impurity regions 519$b$, and third impurity regions 517$b$ are formed in a self-aligned manner in the semiconductor layer in a region to be a capacitor. The first impurity region 521$b$ is formed in a region overlapping with the gate electrode 506 with the gate insulating layer interposed therebetween. Note that an impurity element is selectively added at a high concentration to the first impurity region 521$b$ before formation of the gate electrode 506. Accordingly, the impurity concentration of the first impurity region 521$b$ is higher than those of the channel formation regions 521$a$ and 521$c$. Note that the low concentration impurity regions 519$a$ and 519$c$ which serve as LDD regions and the second impurity regions 519$b$ are formed under the sidewall insulating layers 510.

Note that the structure is described in which the LDD regions are formed in the semiconductor layer included in the n-channel thin film transistor and the LDD regions are not formed in the semiconductor layer included in the p-channel thin film transistor; however, the present invention is not limited thereto. The LDD regions may be formed in the semiconductor layers included in both the n-channel thin film transistor and the p-channel thin film transistor.

Next, a fourth insulating layer 522 containing hydrogen is deposited by a sputtering method, an LPCVD method, a plasma CVD method, or the like, and then activation treatment and hydrogenation treatment of the impurity element added to the semiconductor layer are performed. Heat treatment (at a temperature of 300° C. to 550° C. for 1 to 12 hours) in a furnace or an RTA method using a lamp light source is used for the activation treatment and hydrogenation treatment of the impurity element. For example, a silicon nitride oxide layer which is obtained by a plasma CVD method is used for the fourth insulating layer 522 containing hydrogen. Here, the thickness of the fourth insulating layer 522 containing hydrogen is 50 nm to 200 nm. Besides, in the case where the semiconductor layer is crystallized using a metal element which promotes crystallization, typically nickel, gettering which reduces nickel in the channel formation region can also be performed at the same time as the activation. Note that the fourth insulating layer 522 containing hydrogen is a first layer of an interlayer insulating layer.

Next, a fifth insulating layer 523 which serves as a second layer of the interlayer insulating layer is formed by a sputtering method, an LPCVD method, a plasma CVD method, or the like. An insulating layer in a single layer or stacked layers such as a silicon oxide layer, a silicon nitride layer, or a silicon oxynitride layer is used as the fifth insulating layer 523. Here, the thickness of the fifth insulating layer 523 is 300 nm to 800 nm.

Next, a resist mask is formed over the fifth insulating layer 523 and the fourth insulating layer 522 and the fifth insulating layer 523 are selectively etched, so that a first opening 520 which reaches the first electrode 509 is formed. The resist mask is removed after the etching. A diameter of the first opening 520 may be approximately 1 µm to 6 µm. In this embodiment, the diameter of the first opening 520 is 2 µm.

A cross-sectional view of the semiconductor device manufactured through the preceding steps corresponds to FIG. 11A.

Next, a silicon oxynitride layer and an amorphous silicon layer are formed by a sputtering method, an LPCVD method, a plasma CVD method, or the like to be stacked. In this embodiment, a silicon oxynitride layer with a thickness of 3 nm to 5 nm and an amorphous silicon layer with a thickness of 30 nm are sequentially stacked by a plasma CVD method. Then, a resist mask is formed and the amorphous silicon layer and the silicon oxynitride layer are selectively etched, so that a silicon oxynitride layer 524$a$ and an amorphous silicon layer 524$b$ which overlap with the first opening 520 are formed The silicon oxynitride layer 524$a$ and the amorphous silicon layer 524$b$ will collectively function as a resistance material layer of the antifuse. The resist mask is removed after the etching.

A cross-sectional view of the semiconductor device manufactured through the preceding steps corresponds to FIG. 11B.

Next, a resist mask is formed and the fourth insulating layer 522 and the fifth insulating layer 523 are selectively etched, so that contact holes which reach the semiconductor layers, contact holes which reach the gate electrodes, and a second opening which reaches the first electrode 509 are formed. The resist mask is removed after the etching.

A cross-sectional view of the semiconductor device manufactured through the preceding steps corresponds to FIG. 11C.

Next, oxide films formed on exposed surfaces of the semiconductor layers, the gate electrodes 504, 505, 506, 507 and 508, the first electrode 509, and the amorphous silicon layer 524$b$ are removed with an etchant containing hydrofluoric acid, and at the same time, the exposed surfaces thereof are washed.

Next, a conductive layer is formed by a sputtering method to form an upper electrode of the antifuse, the source and drain electrodes and the like of the thin film transistors, and the like. This conductive layer is formed in a single layer or stacked layers of a substance such as tungsten, titanium, aluminum, nickel, chromium, molybdenum, tantalum, cobalt, zirconium, vanadium, palladium, hafnium, platinum, or iron, or an alloy material or a compound material thereof. However, in the case where the conductive layers are stacked, one layer which is in contact with the amorphous silicon layer 524b is preferably formed using a material which reacts with silicon in order to be used for the upper electrode of the antifuse. Further, this conductive layer is also used for the source and drain electrodes of the thin film transistors. Therefore, it is preferable to use a material which has relatively low contact resistance with the semiconductor layer of the thin film transistor. For example, a three-layer structure of a titanium layer, an aluminum layer containing a minute amount of silicon, and a titanium layer or a three-layer structure of a titanium layer, an aluminum alloy layer containing nickel and carbon, and a titanium layer is employed. In this embodiment, a three-layer structure of a 100 nm thick titanium layer, a 350 nm thick pure aluminum layer, and a 100 nm thick titanium layer is employed. Further, this embodiment shows the example in which a tungsten layer is used as a material of the lower electrode of the antifuse and a titanium layer is used as a material of the upper electrode. However, the materials are not particularly limited as long as they can change the state of the resistance material layer from a high resistance state to a low resistance state and the same material may be used for the upper electrode and the lower electrode of the antifuse. When the lower electrode and the upper electrode of the antifuse are formed using the same material, they are formed to have a single layer structure or a stacked-layer structure of a material which is selected from a substance such as tungsten, titanium, aluminum, nickel, chromium, molybdenum, tantalum, cobalt, zirconium, vanadium, palladium, hafnium, platinum, or iron, an alloy material or a compound material thereof.

Next, a resist mask is formed, and the conductive layer is selectively etched, so that conductive layers 525, 526, 527, 528, 529, 530, 531, 532, 533 and 534 which serve as source or drain electrodes, wirings 535, 536, 537, 538 and 539 which serve as gate lead wirings, a second electrode 540 and a third electrode 541 of a memory portion, and a fourth electrode 542 of an antenna portion are formed. The second electrode 540 overlaps with the first opening 520 to serve as the upper electrode of the antifuse. In addition, the third electrode 541 overlaps with the second opening to be electrically connected to the first electrode 509. Note that the fourth electrode 542 is electrically connected to thin film transistors of an antenna portion and power supply portion, though the connection is not illustrated here. The resist mask is removed after the etching.

A cross-sectional view of the semiconductor device manufactured through the preceding steps corresponds to FIG. 11D. In this embodiment, thin film transistors of a logic circuit portion 550, a thin film transistor and an antifuse 560 of the memory portion 552, and thin film transistors of the antenna portion and power supply portion 554 can be formed over the same substrate. FIG 11D is a cross-sectional view of a p-channel thin film transistor and an n-channel thin film transistor which are provided in the logic circuit portion 550, an p-channel thin film transistor and the antifuse 560 which are provided in the memory portion 552, and a capacitor and an n-channel thin film transistor which are provided in the antenna portion and power supply portion 554. Note that the present invention is not limited thereto and the thin film transistor provided in the memory portion 552 may be an n-channel thin film transistor. Further, a p-channel thin film transistor may be provided in the antenna portion and power supply portion 554. Here, one n-channel thin film transistor is illustrated for convenience.

Next, a sixth insulating layer 543 which covers the thin film transistors of the logic circuit portion 550, the thin film transistor and the antifuse of the memory portion 552, and the thin film transistor of the antenna portion and power supply portion 554, is formed. An insulating layer containing silicon oxide or an insulating layer formed using an organic resin can be used as the sixth insulating layer 543. The insulating layer containing silicon oxide is preferably used to improve reliability of a radio chip. Alternatively, an insulating layer formed using an organic resin formed by a coating method is preferably used because the sixth insulating layer 543 preferably has a planarized surface in the case where an antenna to be formed later is formed by a screen printing method. The material for forming the sixth insulating layer 543 may be appropriately selected by practitioners. Further, the antenna to be formed later may be formed so as to reach a region which overlaps with the logic circuit portion 550 and the memory portion 552. In this case, the sixth insulating layer 543 also functions as an interlayer insulating layer which isolates the element of the logic circuit portion 550 and the element of the memory portion 552 from the antenna. In the case where the antenna has a circular shape (for example, a loop antenna) or a spiral shape, one of both ends of the antenna is led by a wiring of a lower layer; thus, it is preferable to provide the sixth insulating layer 543. However, in the case where a microwave method is employed and the antenna has a linear shape (for example, a dipole antenna), a flat shape (for example, a patch antenna), or the like, the antenna to be formed later can be arranged so as not to overlap with the logic circuit portion and the memory portion; thus, the sixth insulating layer 543 is not necessarily provided.

Next, a resist mask is formed, and the sixth insulating layer 543 is selectively etched, so that a third opening which reaches the third electrode 541 and a fourth opening which reaches the fourth electrode 542 are formed. The resist mask is removed after the etching.

A cross-sectional view of the semiconductor device manufactured through the preceding steps corresponds to FIG. 12A.

Next, a metal layer is formed over the sixth insulating layer 543. A single layer which is selected from Ti, Ni, and Au or stacked layers thereof are used as the metal layer Then, a resist mask is formed, and the metal layer is selectively etched, so that a lead wiring 544 is formed in a lead wiring portion 562 of the first electrode 509 and a base layer 545 of the antenna is formed. Note that the lead wiring 544 and the base layer 545 here can be selectively formed by a sputtering method using a metal mask without using the resist mask, as well. When the base layer 545 of the antenna is provided, a large contact area with the antenna can be secured. In addition, the lead wiring 544 is not necessarily formed depending on a layout of a circuit design.

A cross-sectional view of the semiconductor device manufactured through the preceding steps corresponds to FIG. 12B.

Next, an antenna 546 is formed over the base layer 545 of the antenna. The antenna 546 can be formed by such a method in which a metal layer of Al, Ag, or the like is formed by a sputtering method and then is selectively etched into a desired shape. Alternatively, the antenna 546 can be formed by a screen printing method. A screen printing method refers to a method in which an ink or a paste, which is provided on a screen plate formed in such a manner that a predetermined pattern is formed by a photosensitive resin on a base made of a metal mesh or a high molecular compound fiber mesh is transferred to a work which is placed on the opposite side of the screen plate, with the use of a rubber, plastic, or metal blade which is called a squeegee. A screen printing method has a merit that pattern formation in a relatively large area is realized at low cost.

A cross-sectional view of the semiconductor device manufactured through the preceding steps corresponds to FIG.

12C. In this embodiment, the thin film transistors of the logic circuit portion 550, the thin film transistor and the antifuse of the memory portion 552, and the thin film transistor and the antenna of the antenna portion and power supply portion 554 can be formed over the same substrate.

Next, the metal layer 502 and the substrate 501 are removed by separation. Separation can occur inside the metal oxide layer, at an interface between the first insulating layer 503 and the metal oxide layer, or an interface between the metal oxide layer and the metal layer 502, so that a portion which is over the first insulating layer 503 to be the radio chip can be separated from the substrate 501 with relatively less force. When the metal layer 502 and the substrate 501 are removed, a fixing substrate may be attached to the side where the antenna is provided.

Next, one sheet over which a plurality of radio chips are formed is divided by a cutter, dicing, or the like so as to be divided into individual radio chips. In addition, with the use of a method in which each radio chip is picked up and separated, this dividing step is not needed.

Next, the radio chip is fixed to a sheet-like base. As the sheet-like base, plastic, paper, a prepreg, a ceramic sheet, or the like can be used. The radio chip may be fixed so as to be interposed between two sheet-like bases, or the radio chip may be fixed to one sheet-like base with a bonding layer. As the bonding layer, various curable adhesives such as a reactive curable adhesive, a thermosetting adhesive, and a photo curable adhesive such as an ultraviolet curable adhesive, and an anaerobic adhesive can be used. Alternatively, the radio chip can be arranged in the middle of making paper, thereby being provided inside one piece of paper.

The radio chip manufactured through the preceding steps includes antifuses in the memory portion 552, and the antifuse is in one state selected from three states which are "a first state" which is an initial state, "a second state" which is a writing state and "a third state" which is a writing state. "The second state" and "the third state" can be obtained by performing writing into the antifuse in "the first state". The antifuse provided in the memory portion 552, in manufacture, is in an initial state (the first state). A writing voltage is applied to the antifuse in an initial state (the first state) by a writing circuit, whereby the state of the antifuse can be changed to "the second state" or "the third state". "The second state" and "the third state" are different writing states, and writing can be performed by the writing circuit which corresponds to each state. The electric resistances of "the first state", "the second state" and "the third state" are different from one another Te electric resistance of "the first state" which is an initial state is the highest. Further, "the second state" obtained by performing writing operation to "the first state" is not changed to "the third state" or "the first state" even when further writing is performed. Furthermore, "the third state" obtained by performing writing operation to "the first state" is not changed to "the second state" or "the first state" even when further writing is performed. Note that as described above, the memory portion 552 includes a plurality of antifuses and data writing into the antifuses included in the memory portion 552 is performed in blocks. As for the antifuses included in the memory portion 552, it is distinguished in blocks whether or not data has been written. The antifuses in "the first state" are present in a block where data has not been written. In a block where data has been written, only the antifuses in "the second state" or "the third state" are provided and the antifuses in "the first state" are not present. In the block where the data has been written, the antifuse in "the second state" and the antifuse in "the third state" correspond to the binary data, whereby the data is written. Since the state of the antifuse in "the second state" or "the third state" is not changed to the other state as described above even when further writing is performed, there is no possibility that the data which is once input to the radio chip is falsified. Further, when the antifuses in "the first state" are present in the radio chip, write-once read-many memory where new data can be input (written additionally) can be realized. Note that writing data or distinguishing whether or not data has been written may also be performed in memory cells.

Further, the radio chip of this embodiment can be provided as ROM manufactured in such a manner that the state of each antifuse is changed to "the second state" or "the third state" by performing writing at the time of manufacturing the radio chip or after manufacturing the radio chip, the binary data is fixed to each antifuse, and data is written. Alternatively, when the radio chip is provided, it can be provided as write-once read-many memory including antifuses in "the first state", where new data can be written. In a case of write-once read-many memory, the memory where no data has been written may be provided or the memory including a block where data has been written and a block where data has not been written, in part of which data has been written and where data can be written additionally may be provided. In any case, a radio chip in which falsification of data once written is impossible and data can be written additionally as needed can be provided. For example, after a radio chip fixed to a flexible sheet-like base is attached to an article with a curved surface, data can be input to an antifuse-type memory included in the radio chip.

This embodiment can be freely combined with any of the embodiment modes.

Embodiment 2

In this embodiment, a structure example and an operation example of a semiconductor device serving as a radio chip will be described.

Figure 14A:
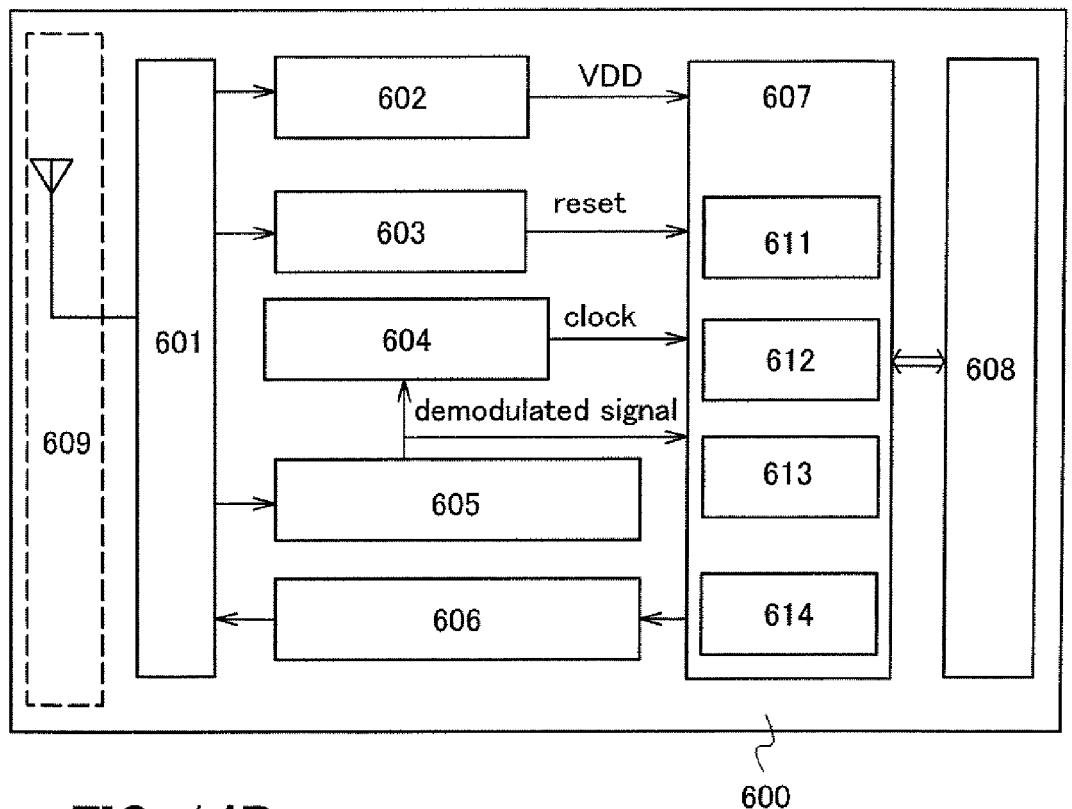
FIG. 14A is a block diagram illustrating an example of the semiconductor device of the present invention and FIGS. 14B and 14C are diagrams illustrating examples of usage modes thereof.

A semiconductor device described in this embodiment is a radio chip having a function of communicating data without contact. A semiconductor device 600 illustrated in a block diagram of FIG. 14A is an example thereof and includes a high frequency circuit 601, a power supply circuit 602, a reset circuit 603, a clock generation circuit 604, a data demodulation circuit 605, a data modulation circuit 606, a control circuit 607 which controls other circuits, a memory circuit 608 and an antenna 609.

The memory circuit 608 has memory including antifuses of the present invention. Further, in some cases, the memory circuit 608 includes a circuit for writing data into the memory and a circuit for reading the data written into the memory, which are described as circuits which are not included in the memory circuit in the above embodiment modes and embodiment. Furthermore, the memory circuit 608 may have memory with a different structure in addition to memory including antifuses. As memory with a different structure, for example, DRAM, SRAM, FeRAM, PROM, EPROM, EEPROM, flash memory, or the like can be given. Note that the memory circuit 608 has memory including the antifuses of the present invention, and the memory including the antifuses may be ROM or write-once memory including antifuses where data has not been written. Note that the memory cell where data has been written includes an antifuse in "a second state" or "a third state".

The high frequency circuit 601 receives a signal from the antenna 609, and outputs a signal, which is received from the data modulation circuit 606, from the antenna 609. The power supply circuit 602 generates a power supply potential from a received signal. The reset circuit 603 generates a reset signal. The clock generating circuit 604 generates various clock signals based on a received signal input from the antenna 609. The data demodulation circuit 605 demodulates a received signal and outputs the demodulated signal to the control circuit 607. The data modulation circuit 606 modulates a signal received from the control circuit 607. In the control circuit 607, a code extraction circuit 611, a code determination circuit 612, a CRC determination circuit 613, and an output unit circuit 614 are included. Note that the code extraction circuit 611 is a circuit which extracts a plurality of codes included in an instruction transmitted to the control circuit 607. The code determination circuit 612 is a circuit which judges the content of the instruction by comparing the extracted code with a reference code. The CRC determination circuit 613 is a circuit which detects the presence of transmission errors and the like based on the judged code.

Next, an example of an operation of the above-described semiconductor device 600 will be described. First, a radio signal is received by the antenna 609. When the radio signal is transmitted to the power supply circuit 602 through the high frequency circuit 601, a high power supply potential (hereinafter referred to as VDD) is generated. The VDD is supplied to various circuits in the semiconductor device 600. A signal transmitted to the data demodulation circuit 605 through the high frequency circuit 601 is demodulated (hereinafter, such a signal is referred to as a demodulated signal). Moreover, signals passed through the reset circuit 603 and the clock generating circuit 604 via the high frequency circuit 601, and the demodulated signal are transmitted to the control circuit 607. The signal transmitted to the control circuit 607 is analyzed by the code extraction circuit 611, the code determination circuit 612, the CRC determination circuit 613, and the like. Then, based on the analyzed signals, data is written into the memory circuit 608 or data of the semiconductor device 600, which is written into the memory circuit 608, is output.

For example, writing data into memory provided with antifuses, which is included in the memory circuit 608, can be performed in blocks (or in memory cells). At this time, writing data into antifuses in a block where data is to be written is inevitably performed, so that the state of each of the antifuses is changed from "a first state" which is an initial state to "the second state" or from "the first state" to "the third state". Writing into the antifuse may be performed by directly instructing a writing circuit corresponding to the antifuse by a radio signal or by selecting the writing circuit corresponding to the antifuse through a circuit which instructs writing into the memory. Note that even if writing into the antifuse in "the second state" is performed in accordance with the analyzed signal, the state of the antifuse is not changed to "the third state" or "the first state". Even if writing into the antifuse in "the third state" is performed in accordance with the analyzed signal, the state of the antifuse is not changed to "the second state" or "the first state". Accordingly, it is impossible to rewrite data once written. When a block where data has not been written is present, including antifuses in "the first state", new data can be written. However, a case where the memory circuit 608 includes memory except the memory which has the antifuses of the present invention is not limited to this.

When data written into the memory circuit 608 is output, the data is read in accordance with the analyzed signal. The memory circuit 608 includes memory which has the antifuses of the present invention. In the block where data has been written, antifuses in "the second state" or "the third state" are present and the data has been written. Reading from the antifuse may be performed directly by a radio signal or may be performed through a circuit which instructs reading of the data written into the memory.

The output data of the semiconductor device 600 is encoded through the output unit circuit 614. Furthermore, the encoded data of the semiconductor device 600 is converted into a radio signal and transmitted by the antenna 609 through the data modulation circuit 606. Note that a low power source potential (hereinafter called VSS) is common in the various circuits included in the semiconductor device 600 and VSS can be set to VGND. being In such a semiconductor device 600, data can be written by a radio signal with the use of a communication device in which transmitting/receiving, transmitting, or receiving of a radio signal (e.g. a reader/writer, or a communication device having a function of one of a reader and a writer) can be conducted. Further, the data written into the semiconductor device 600 can be read by a radio signal.

Note that the semiconductor device 600 may supply a power supply voltage to various circuits by an electromagnetic wave without a power source (battery) mounted, or by an electromagnetic wave and a power source (battery) with the power source (battery) mounted.

Figure 14B:
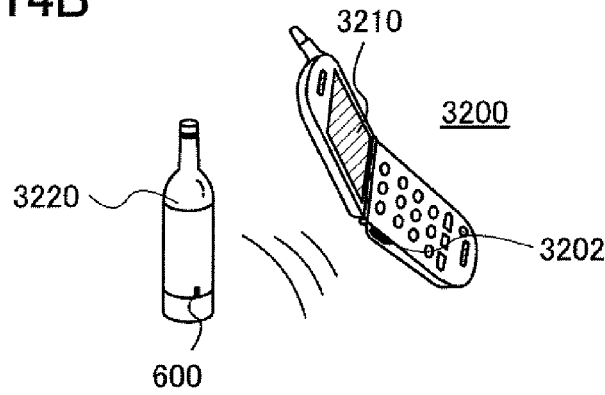

Next, an example of a use mode of a semiconductor device according to the present invention, which serves as a radio chip, will be described. FIG. 14B illustrates a portable data terminal 3200 and a product 3220.

The portable data terminal 3200 has a display portion 3210 and a communication unit 3202 on a side surface. As an example of the communication unit 3202, a reader/writer having a function of reading and transmitting a signal, a reader having a function of only reading a signal, or a writer having a function of transmitting a signal can be given.

The semiconductor device 600 is attached to the product 3220. The semiconductor device 600 functions as a radio chip described above, and a variety of data such as a raw material and a place of origin of the product 3220 can be written into the semiconductor device 600. Note that for example, a flag is placed in a block where data has been written so that it is judged whether the data has been written into the block. Since the semiconductor device 600 of the present invention has a structure in which falsification of data once written can be prevented, there is no possibility that the data such as a raw material and a place of origin is rewritten as false data. It is possible to make a block where data has not been written present in the semiconductor device 600 to write data thereinto additionally, and for example, an inspection result for each production step, a history of the distribution process, and the like can be written into the block where data has not been written. In this case, a plurality of blocks where data has not been written is provided so that writing can be performed in each production step. The blocks where data has not been written, after data has been written therein, are judged as blocks where data has been written.

The portable data terminal 3200 having the communication unit 3202 is held to the semiconductor device 600 attached to the product 3220. The communication unit 3202 reads the data written into the semiconductor device 600 and the data such as a raw material, a place of origin, an inspection result for each production step or a history of the distribution process of the product 3220 can be displayed in the display portion 3210.

Figure 14C:
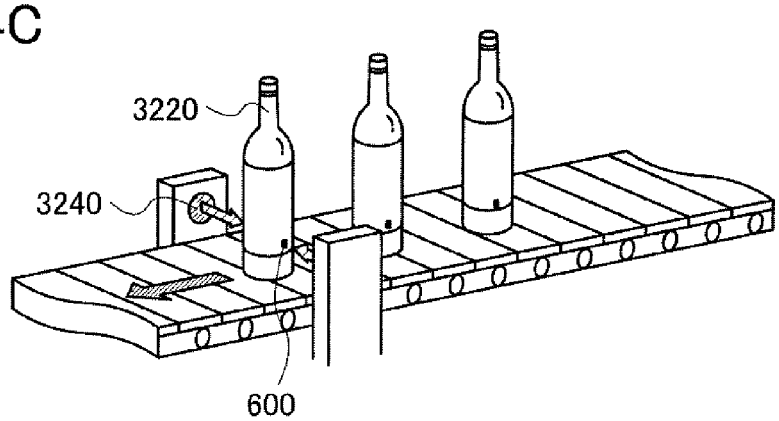
Figure 15A:
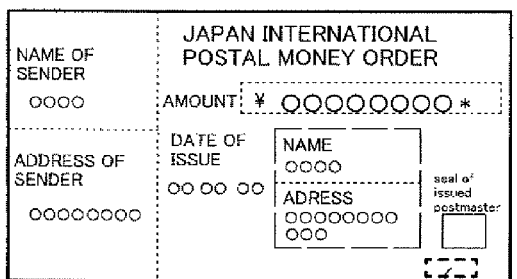
FIGS. 15A to 15H are diagrams each illustrating an application example of the semiconductor device of the present invention.
Figure 15B:
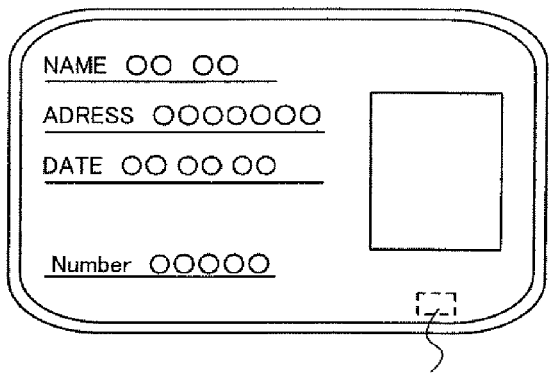
Figure 15C:
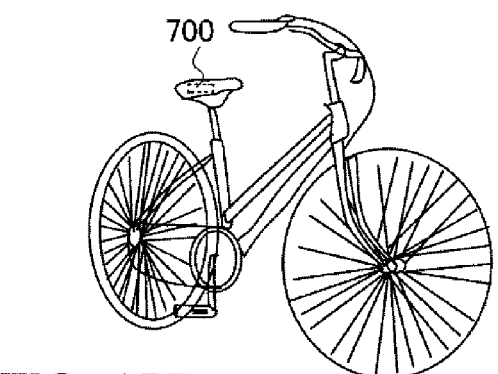
Figure 15D:
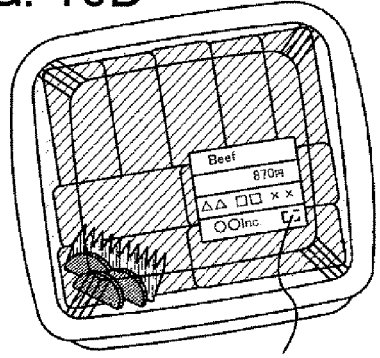
Figure 15E:
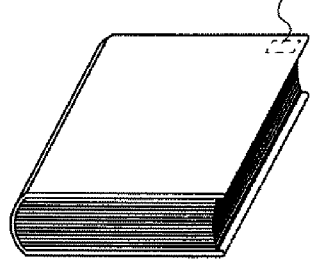
Figure 15F:
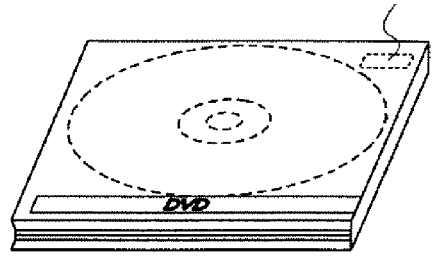
Figure 15G:
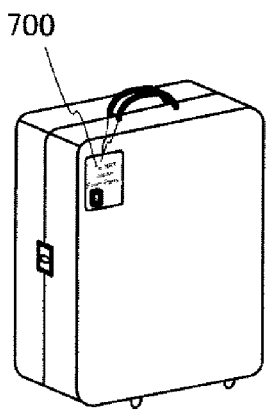
Figure 15H:
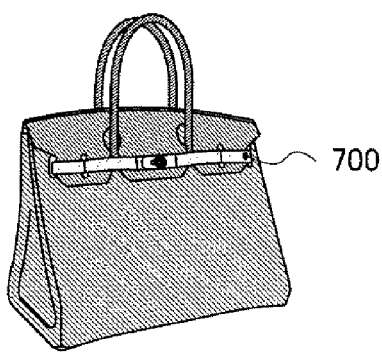

Further, as illustrated in FIG. 14C, when the product 3220 to which the semiconductor device 600 is attached is transferred by a conveyer belt, the data in the semiconductor device 600 is read by a communication unit 3240, whereby the product 3220 can be inspected. Furthermore, the inspection result can be written into the semiconductor device 600 as data by the communication unit 3240. Thus, by utilizing the semiconductor device of the present invention for a system, data can be acquired easily, and improvement in performance and added value of the system can be achieved. Since falsification of data once written is prevented, forgery of a product can be prevented.

Note that applications of the present semiconductor device is wide in addition to the above, and the semiconductor device can be applied to any product as long as it needs to have definite data of production, distribution, sales or management of an object. For example, the semiconductor device can be attached to paper money, coins, securities, certificates, bearer bonds, packing containers, books, recording media, personal belongings, luggage, vehicles, food, clothes, health products, commodities, medicine, electronic devices, and the like. Examples of these will be described, with reference to FIGS. 15A to 15H. Note that FIGS. 15A to 15H each illustrate an example in which a radio chip 700 is provided as the semiconductor device 600.

The paper money and coins are money that circulates in the market, and include one that can be used in the same way as money in a specific area (cash voucher), memorial coins, and the like. The securities refers to checks, certificates, promissory notes, and the like (see FIG. 15A). The certificates include driver's licenses, resident cards, and the like (see FIG. 15B). The vehicles include wheeled vehicles such as bicycles, vessels, and the like (see FIG. 15C). The packing containers include paper for wrapping a lunch box or the like, plastic bottles, and the like (see FIG. 15D). The books include hardbacks, paperbacks, and the like (see FIG. 15E). The recording media include DVD software, video tapes, and the like (see FIG. 15F). The personal belongings include bags, glasses, and the like (see FIG. 15H). The Luggage includes baggage, express package, and the like (see FIG. 15G). The bearer bonds refer to stamps, rice coupons, various gift certificates, and the like. The foods include food items, beverages, and the like. The clothes includes clothing, footwear, and the like. The health products include medical devices, health appliances, and the like. The commodities include furniture, lighting apparatus, and the like. The medicals include medicines, agricultural chemicals, and the like. Electronic devices include liquid crystal display devices, EL display devices, television devices (television receivers and flat-screen television receivers), cellular phones, and the like.

By providing the radio chip 700 for paper money, coins, certificates, bearer bonds, and the like, forgery can be prevented. The efficiency of an inspection system, a system used in a rental shop, or the like can be improved by providing the radio chip 700 for the packing containers, the books, the recording media, the personal belongings, the food, the commodities, the luggage, the electronic devices, or the like. Forgery or theft can be prevented by providing the radio chip 700 for the vehicles, the health products, the medicine, the luggage, or the like. As for medicines, medicine can be prevented from being taken mistakenly. The radio chip 700 is provided by being attached to a surface of an article or being embedded in an article. For example, in the case of a book, the radio chip may be embedded in a piece of paper; in the case of a package made from an organic resin, the radio chip may be embedded in the organic resin. In addition, when the radio chip is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

In particular, it is effective to use a radio chip to which the present invention is applied for traceability of the food. The radio chip to which the present invention is applied has a structure in which new data can be written, but data once written cannot be rewritten. Accordingly, when a vendor changes in each step of production, distribution, sales, and the like of the food, the following vendor cannot falsify the data which is written by the previous vendor.

Here, an example in which a radio chip to which the present invention is applied is used for traceability of the food will be described. For example, an example will be described in which a radio chip to which the present invention is applied is used for distribution of beef.

First, target beef cattle A is born in a stock farm S, for example. An administrator of the beef cattle A (a feeder of beef cattle, an administrator of a common nurturing and training center of beef cattle, a breeding center of beef cattle or a fattening center of beef cattle, an administrator of a ranch, or the like, and here, an administrator of the stock farm S) has the birth registered and receives an individual identification number of the beef cattle A. The individual identification number is a ten-digit number which includes a specific serial number for each production area and each administrator. The individual identification number is assigned to the beef cattle A as an ear mark, for example.

At this time, a radio chip where the individual identification number has been written into a predetermined block in advance is incorporated with the ear mark. A semiconductor device of the present invention is used as a radio chip incorporated with the ear mark, whereby falsification of the individual identification number can be prevented. Of course, the individual identification number may be written after attachment to the beef cattle A as an ear mark A; however, the radio chip where the individual identification number is written in advance is preferably assigned to each beef cattle, so that presence of overlapping individual identification numbers due to writing of a wrong number, or the like can be prevented, which leads to easy administration.

It is preferable to further write a name, sex, a type, blood, and the like in the radio chip incorporated with the ear mark. Accordingly, it is preferable that a plurality of blocks where data has not been written are present in the radio chip and necessary data be written into the blocks where data has not been written as needed. Of course, after writing data in the blocks where data has not been written as needed, the blocks are judged as the blocks where the data has been written. By applying the present invention to the radio chip incorporated with the ear mark, falsification of data once written can be prevented. Note that the content of data written into the radio chip which is incorporated with the ear mark is read by a transmitting and receiving device such as a reader/writer and registered in a management server.

When the beef cattle A is moved to another administrator (a feedlot, or the like) before it is slaughtered, data such as the place where it is moved is written into the block where data has not been written of the radio chip as needed. Note that when data is newly written into the radio chip, the data is read by a transmitting and receiving device such as a reader/writer and the content thereof is registered in a management server.

The beef cattle A is slaughtered in a slaughter house T to become beef. The slaughtered beef cattle A is generally distributed from the slaughter house T to a meat processor, and the like as a beef carcass A'. The data written into the radio chip to a step of slaughter is copied and a radio chip where the copied data is written is newly attached to the beef carcass Al of the beef cattle A. When there exist a plurality of beef carcasses A', radio chips where the copied data is written are attached to all the beef carcasses A'. Needless to say, by also applying the present invention to the radio chips where the copied data is written, falsification of the data is prevented. A slaughterer of the beef cattle A (an administrator of an abattoir or a meat center, or the like, and here, an administrator of the slaughter house T) writes the date of slaughter, the place of slaughter and the like to a block where data has not been written of the radio chip attached to the beef carcass A'. Of course, the radio chip may be attached to the target beef carcass A' after writing the data such as the date of slaughter to the radio chip where the copied data is written. A grade, weight, a shipment destination, the date of shipment, of the beef carcass A', or the like is also written into the block where data has not been written. Note that the content of the data written into the radio chip is read by a transmitting and receiving device such as a reader/writer and is registered in a management server.

The beef carcass A' is processed into part beef A" of the beef carcass A' by a food processor U. The processed beef carcass A' is distributed as a plurality of part beef A" of the beef carcass A' from the food processor U to retailers, specific cooking providers, or the like. The data written into the radio chip which is attached to the carcass A' is copied and a radio chip where the copied data is written is newly attached to each part beef A" of the beef carcass A'. Of course, by also applying the present invention to the radio chip where the copied data is written, falsification of the data is prevented. A processor of the beef carcass A' (here, the food processor U) writes a weight, a purchaser, the date of purchase, a seller, the date of sales of the part beef A" of the beef carcass A', or the like in the block where data has not been written. Note that the content of the data written into the radio chip is read by a transmitting and receiving device such as a reader/writer and is registered in a management server.

The part beef A" of the beef carcass A' is processed into beef A'" which is smaller than the part beef A" of the beef carcass A' by a retailer V and sold to consumers W. The retailer V copies the data written into the radio chip which is attached to the part beef A" of the beef carcass A' and further writes a purchaser, the date of purchase, or the like in the block where data has not been written into a radio chip where the copied data is written. In selling each beef A'" which is smaller than the part beef A" of the beef carcass A', the radio chip is attached to each beef A'" which is smaller than the part beef A" of the beef carcass A'. Of course, by also applying the present invention to the radio chip where the copied data is written, falsification of the data is prevented. The content of the data written into the radio chip is read by a transmitting and receiving device such as a reader/writer and is registered in a management server. In this manner, in distribution steps from the stock farm S to the retailer V, data can be written into a block where data has not been written as needed. Further, a block where data has not been written, after writing data thereto, is judged as a block where data has been written; therefore, there is no possibility that the data is falsified.

The consumer W who purchased or is considering purchasing the beef A'" which is smaller than the part beef A" of the beef carcass A) can see the data written into the block where the data has been written of the radio chip attached to the beef A'" which is smaller than the part beef A" of the beef carcass A', with the use of a data reference system provided in a store. As the a data reference system, for example, the data written into the radio chip can be read by a transmitting and receiving device such as a reader/writer and the data written into the block where the data has been written can be displayed on a screen of a personal computer which interfaces with the transmitting and receiving device and the management server.

A radio chip to which the present invention is applied is used for traceability of the beef cattle and the beef which are described here. The present invention can prevent falsification of data once written. Accordingly, when the present invention is applied to a production step and a distribution step in each of which an administrator, or the like is different, such as traceability of beef cattle and beef, falsification such as rewriting the data in the previous step can be prevented when the administrator changes. In the above-described example, the retailer V can be prevented from committing an injustice such as rewriting a place of origin such as a birthplace, a grade of beef, or the like for false labeling to sell the beef at high cost. Thus, the consumer W can see accurate data and can be prevented from suffering disadvantage due to false labeling. Note that an example in which the present invention is applied to traceability of beef cattle and beef is described here; however, needless to say, the present invention can be applied widely to other food, products, craftwork, or the like.

Further, it is also effective to use a radio chip to which the present invention is applied for inspection and management of baggage at an airport, or the like. As described above, the radio chip to which the present invention is applied has a structure in which it is possible to write new data in a block where data has not been written, but it is impossible to rewrite data once written (data in the block where the data has been written). Accordingly, when data of an owner of a baggage is input to the radio chip, since others cannot rewrite the data of the owner, theft or the like can be prevented. Furthermore, in a case of inputting the inspection result of a baggage inspection system, even if a hazardous material is to be carried into an airplane, data once written that "it is impossible to carry this into an airplane" cannot be rewritten, which leads to securing of safety.

As described above, data which should not be falsified is written into the radio chip to which the present invention is applied so that writing states such as "the second state" and "the third state" are made to correspond to binary data. By making no memory element in a non-writing state present, falsification of the data can be prevented. Of course, it is possible to leave a memory element which is in a non-writing state and it is also possible to write data additionally using the memory element which is in a non-writing state.

Note that this embodiment can be freely combined with any of the other embodiment modes and embodiment.

This application is based on Japanese Patent Application serial no. 2007-323224 filed with Japan Patent Office on Dec. 14, 2007, the entire contents of which are hereby incorporated by reference.

What is claimed is:

1. A semiconductor device comprising:
   a memory circuit including a memory cell array in which a plurality of memory cells into which "0" and "1" of binary data can be written are arranged;
   a first writing circuit which writes one of "0" and "1" of binary data into one of the plurality of memory cells included in the memory circuit;
   a second writing circuit which writes the other of "0" and "1" of binary data into one of the plurality of memory cells included in the memory circuit; and
   a reading circuit which reads binary data which is written into one of the plurality of memory cells included in the memory circuit,
   wherein each of the plurality of memory cells has an antifuse in one state selected from "a first state" which is an initial state, "a second state" which is obtained by applying a first voltage to the antifuse in "the first state" by the first writing circuit, or "a third state" which is obtained by applying a second voltage to an antifuse in "the first state" by the second writing circuit;

wherein "the second state" or "the third state" of the antifuse corresponds to "0" or "1" of binary data;

wherein a direction of applying the first voltage to the antifuse is different from a direction of applying the second voltage to the antifuse;

wherein a state of the antifuse in "the second state" is not changed to "the third state" or "the first state"; and wherein a state of the antifuse in "the third state" is not changed to "the second state" or "the first state".

2. The semiconductor device according to claim 1, wherein the antifuse has an element structure in which a first electrode, an insulating layer, a silicon layer, and a second electrode are stacked.

3. The semiconductor device according to claim 1, wherein the antifuse has an element structure in which the state is changed from "the first state" to "the second state" or "the third state".

4. The semiconductor device according to claim 1, wherein a selection circuit is provided which selects one of the first writing circuit and the second writing circuit and executes data writing into the memory circuit.

5. The semiconductor device according to claim 1, wherein the antifuse in "the second state" has a higher electric resistance than that in "the third state" and the antifuse in "the first state" has a higher electric resistance than that in "the second state".

6. The semiconductor device according to claim 1, wherein each of the plurality of memory cells has the antifuse and a transistor which is electrically connected to the antifuse; and wherein application of a writing voltage is controlled by the transistor.

7. A method for writing data into memory comprising a memory circuit having a memory cell array where a plurality of memory cells are arranged, wherein each of the plurality of memory cells is provided with an antifuse, into which "0" and "1" of binary data can be written; a first writing circuit; and a second writing circuit, the method comprising:

applying a first voltage to the antifuse in "the first state" by the first writing circuit thereby the state of the antifuse in "a first state" is changed to "a second state" in a case of writing one of "0" and "1" of binary data into one of the plurality of memory cells included in the memory circuit; and applying a second voltage to the antifuse in "the first state" by the second writing circuit thereby the state of the antifuse in "a first state" is changed to "a third state" in a case of writing the other of "0" and "1" of binary data into one of the plurality of memory cells included in the memory circuit, wherein a direction of applying the first voltage to the antifuse is different from a direction of applying the second voltage to the antifuse;

wherein a state of the antifuse in "the second state" is not changed to "the third state" or "the first state"; and wherein a state of the antifuse in "the third state" is not changed to "the second state" or "the first state".

8. The method for writing data into memory according to claim 7, wherein the antifuse has an element structure in which a first electrode, an insulating layer, a silicon layer, and a second electrode are stacked.

9. The method for writing data into memory according to claim 7, wherein the antifuse has an element structure in which the state is changed from "the first state" to "the second state" or "the third state".

10. The method for writing data into memory according to claim 7, wherein one of the plurality of memory cells includes the antifuse in "the first state" which is an initial state before the writing operation;

wherein the state of the antifuse in "the first state" is changed to "the second state" when writing operation is performed by the first writing circuit; and wherein the state of the antifuse in "the first state" is changed to "the third state" when writing operation is performed by the second writing circuit.

11. The method for writing data into memory according to claim 7, wherein when the antifuse is in "the second state" or "the third state" in performing writing operation by the first writing circuit or the second writing circuit, "0" or "1" of binary data is not written.

* * * * *